US011444098B2

(12) United States Patent
Son et al.

(10) Patent No.: US 11,444,098 B2
(45) Date of Patent: Sep. 13, 2022

(54) VERTICAL NON-VOLATILE MEMORY DEVICES AND METHODS OF PROGRAMMING THE SAME

(71) Applicant: SAMSUNG ELECTRONICS CO., LTD., Suwon-si (KR)

(72) Inventors: Younghwan Son, Hwaseong-si (KR); Seungwon Lee, Hwaseong-si (KR); Seogoo Kang, Seoul (KR); Juyoung Lim, Seoul (KR); Jeehoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 16/850,244

(22) Filed: Apr. 16, 2020

(65) Prior Publication Data

US 2021/0066344 A1 Mar. 4, 2021

(30) Foreign Application Priority Data

Sep. 4, 2019 (KR) ........................ 10-2019-0109722

(51) Int. Cl.
*H01L 27/11582* (2017.01)
*H01L 29/51* (2006.01)
(Continued)

(52) U.S. Cl.
CPC .... *H01L 27/11582* (2013.01); *G11C 11/5671* (2013.01); *G11C 16/0483* (2013.01);
(Continued)

(58) Field of Classification Search
CPC ............... H01L 23/5226; H01L 29/513; H01L 27/11582; H01L 29/518; H01L 27/11565; H01L 29/42344; H01L 29/4916; H01L 23/5283; H01L 29/7926; H01L 21/3111; H01L 29/40117; H01L 21/31116; H01L 29/7839; H01L 29/47; H01L 29/04; H01L 29/16; H01L 27/11556; H01L 29/7889; H01L 29/0649; H01L 29/1033; H01L 29/1041; H01L 29/40114; H01L 27/11519; H01L 27/11524; H01L 21/76879; H01L 29/42376; G11C 16/10; G11C 11/5671; G11C 16/0483; G11C 16/26; G11C 16/08; G11C 16/0433; G11C 16/30; G11C 16/24; G11C 5/063
USPC ... 257/319, 324, 316, 326, E21.18, E29.309, 257/E21.645, E27.103; 438/264, 591, 438/268
See application file for complete search history.

(56) References Cited

U.S. PATENT DOCUMENTS 7,829,938 B2 11/2010 Bhattacharyya
7,927,953 B2 4/2011 Ozawa
(Continued)

*Primary Examiner* — Mouloucoulaye Inoussa
(74) *Attorney, Agent, or Firm* — Lee IP Law, P.C.

(57) ABSTRACT

A vertical non-volatile memory device includes a channel on a substrate and extending in a first direction perpendicular to an upper surface of the substrate, a first charge storage structure on an outer sidewall of the channel, a second charge storage structure on an inner sidewall of the channel, first gate electrodes spaced apart from each other in the first direction on the substrate, each which surrounds the first charge storage structure, and a second gate electrode on an inner sidewall of the second charge storage structure.

20 Claims, 32 Drawing Sheets

(51) Int. Cl.

| | |
|---|---|
| ***H01L 29/49*** | (2006.01) |
| ***H01L 23/528*** | (2006.01) |
| ***H01L 23/522*** | (2006.01) |
| ***G11C 16/10*** | (2006.01) |
| ***G11C 16/04*** | (2006.01) |
| ***G11C 16/26*** | (2006.01) |
| ***G11C 11/56*** | (2006.01) |
| ***H01L 27/11565*** | (2017.01) |
| ***H01L 21/311*** | (2006.01) |
| ***H01L 21/28*** | (2006.01) |

(52) U.S. Cl.

CPC .............. *G11C 16/10* (2013.01); *G11C 16/26* (2013.01); *H01L 23/5226* (2013.01); *H01L 23/5283* (2013.01); *H01L 27/11565* (2013.01); *H01L 29/4916* (2013.01); *H01L 29/513* (2013.01); *H01L 29/518* (2013.01); *H01L 21/31111* (2013.01); *H01L 21/31116* (2013.01); *H01L 29/40117* (2019.08)

(56) References Cited

U.S. PATENT DOCUMENTS

| | | | | |
|---|---|---|---|---|
| 8,437,192 | B2 | 5/2013 | Lung et al. | |
| 9,385,139 | B2 | 7/2016 | Chang et al. | |
| 9,576,971 | B2 | 2/2017 | Zhang et al. | |
| 9,716,102 | B2 | 7/2017 | Kim et al. | |
| 9,754,961 | B2 | 9/2017 | Yamasaki et al. | |
| 2008/0116506 | A1 | 5/2008 | Lue | |
| 2012/0184078 | A1* | 7/2012 | Kiyotoshi ......... | H01L 27/11573 438/268 |
| 2015/0221667 | A1* | 8/2015 | Fukuzumi ......... | H01L 29/66833 257/314 |
| 2015/0348984 | A1* | 12/2015 | Yada ................. | H01L 27/11524 257/316 |

* cited by examiner

VERTICAL NON-VOLATILE MEMORY DEVICES AND METHODS OF PROGRAMMING THE SAME

CROSS-REFERENCE TO RELATED APPLICATION

Korean Patent Application No. 10-2019-0109722, filed on Sep. 4, 2019, in the Korean Intellectual Property Office, and entitled: "Vertical Non-Volatile Memory Devices and Methods of Programming the Same," is incorporated by reference herein in its entirety.

BACKGROUND

1. Field

Embodiments relate to a vertical non-volatile memory device and a method of programming the same.

2. Description of the Related Art

Memory cells in a VNAND flash memory device may be a single level cell (SLC) in which one bit of data may be stored or a multi-level cell (MLC) in which more than one bit of data may be stored.

SUMMARY

Embodiments are directed to a vertical non-volatile memory device. The vertical non-volatile memory device may include a channel on a substrate and extending in a first direction perpendicular to an upper surface of the substrate, a first charge storage structure on an outer sidewall of the channel, a second charge storage structure on an inner sidewall of the channel, first gate electrodes spaced apart from each other in the first direction on the substrate, each which surrounds the first charge storage structure, and a second gate electrode on an inner sidewall of the second charge storage structure.

Embodiments are also directed to a vertical non-volatile memory device. The vertical non-volatile memory device may include a channel on a substrate and extending in a first direction perpendicular to an upper surface of the substrate and having a cup-like shape, a first charge storage structure on an outer sidewall of the channel, first gate electrodes spaced apart from each other in the first direction on the substrate, each of which surrounds the first charge storage structure, a second gate electrode in an inner space formed by the channel, and a conductive pad having a ring shape contacting an upper surface of the channel and not contacting an upper surface of the second gate electrode.

Embodiments are also directed to a vertical non-volatile memory device. The vertical non-volatile memory device may include a channel on a substrate and extending in a first direction perpendicular to an upper surface of the substrate, a first charge storage structure on an outer sidewall of the channel, a second charge storage structure on an inner sidewall of the channel, first gate electrodes spaced apart from each other in the first direction on the substrate, each of which surrounds the first charge storage structure, a second gate electrode on an inner sidewall of the second charge storage structure, a conductive pad on an upper surface of the channel, a first contact plug on the conductive pad, a first bit line on the first contact plug, a second contact plug on an upper surface of the second gate electrode, and a second bit line on the second gate electrode.

Embodiments are also directed to a vertical non-volatile memory device. The vertical non-volatile memory device may include a first memory structure, a second memory structure, a first bit line between the first and second memory structures, and a second bit line between the first and second memory cells. The first memory structure may include a first channel on a first substrate and extending in a first direction perpendicular to an upper surface of the first substrate, a first charge storage structure on an outer sidewall of the first channel, a second charge storage structure on an inner sidewall of the first channel, first gate electrodes spaced apart from each other in the first direction on the first substrate, each of which surrounds the first charge storage structure, and a second gate electrode on an inner sidewall of the second charge storage structure. The second memory structure may include a conductor on the first memory structure, a second channel on the conductor, the second channel extending in the first direction, a third charge storage structure on an outer sidewall of the second channel, a fourth charge storage structure on an inner sidewall of the second channel, third gate electrodes spaced apart from each other in the first direction on the conductor, each of which surrounds the third charge storage structure, and a fourth gate electrode on an inner sidewall of the fourth charge storage structure. The first bit line may be electrically connected to the first channel. The second bit line may be electrically connected to the second gate electrode.

Embodiments are also directed to a method of programming a vertical non-volatile memory device including cell strings. Each of the cell strings may have a string selection transistor (SST), memory cells, and a ground selection transistor (GST) disposed in series between a bit line and a common source line (CSL), each of the memory cells may include a front gate and a channel, and the memory cells included in each of the cell strings may further commonly include a back gate. In the method, a supply voltage and 0V may be applied to first and second bit lines, respectively, electrically connected to an inhibit string and a program string, respectively. A pass voltage may be applied to each of a selected word line and an unselected word line. 0V may be applied to a first back gate commonly included in memory cells of the program string. 0V may be applied to the unselected word line with the selected word line being at the pass voltage. A program voltage may be applied to the first back gate.

BRIEF DESCRIPTION OF THE DRAWINGS

Features will become apparent to those of skill in the art by describing in detail example embodiments with reference to the attached drawings in which.

DETAILED DESCRIPTION

Herein, a direction substantially perpendicular to an upper surface of a substrate may be defined as a first direction, and two directions substantially parallel to the upper surface of the substrate and crossing each other may be defined as second and third directions, respectively. In an example embodiment, the second and third directions may be substantially perpendicular to each other.

Figure 1:
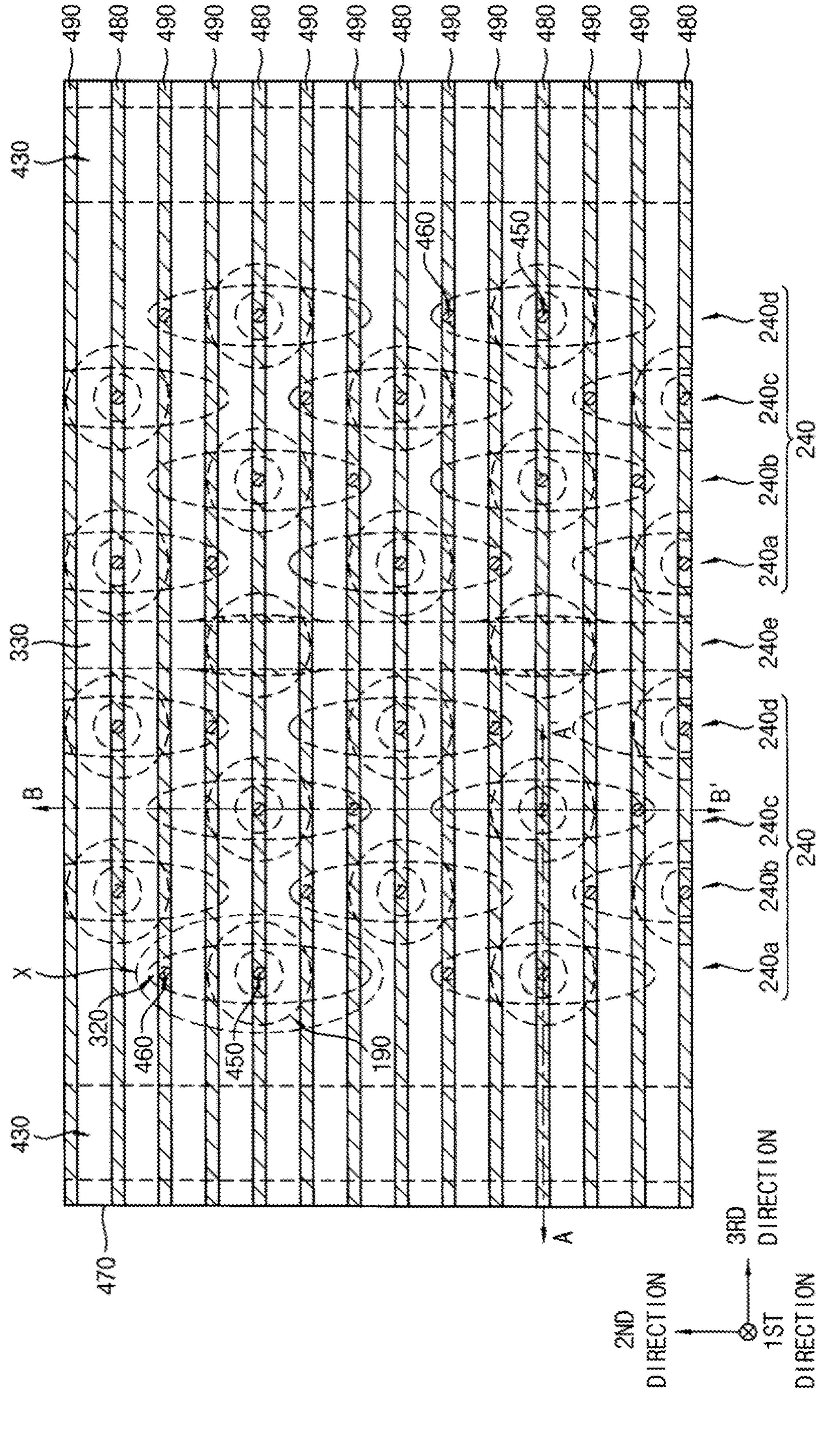
FIGS. 1 to 4 are plan views and cross-sectional views illustrating a vertical non-volatile memory device in accordance with an example embodiment.
Figure 2:
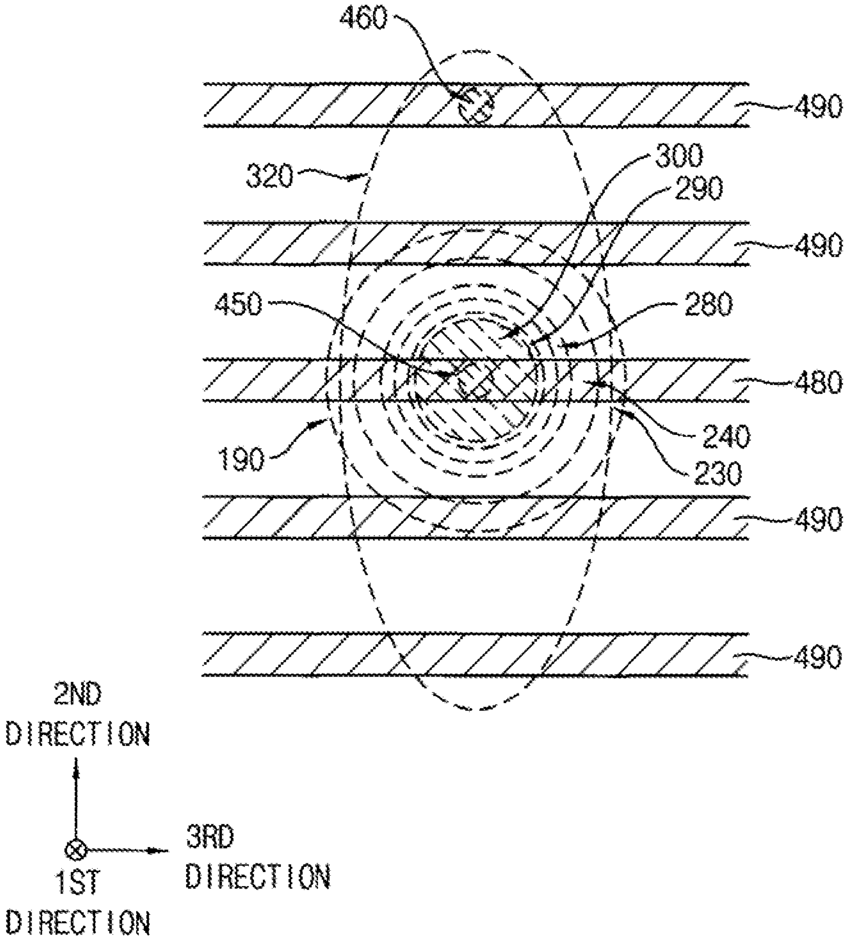
Figure 3:
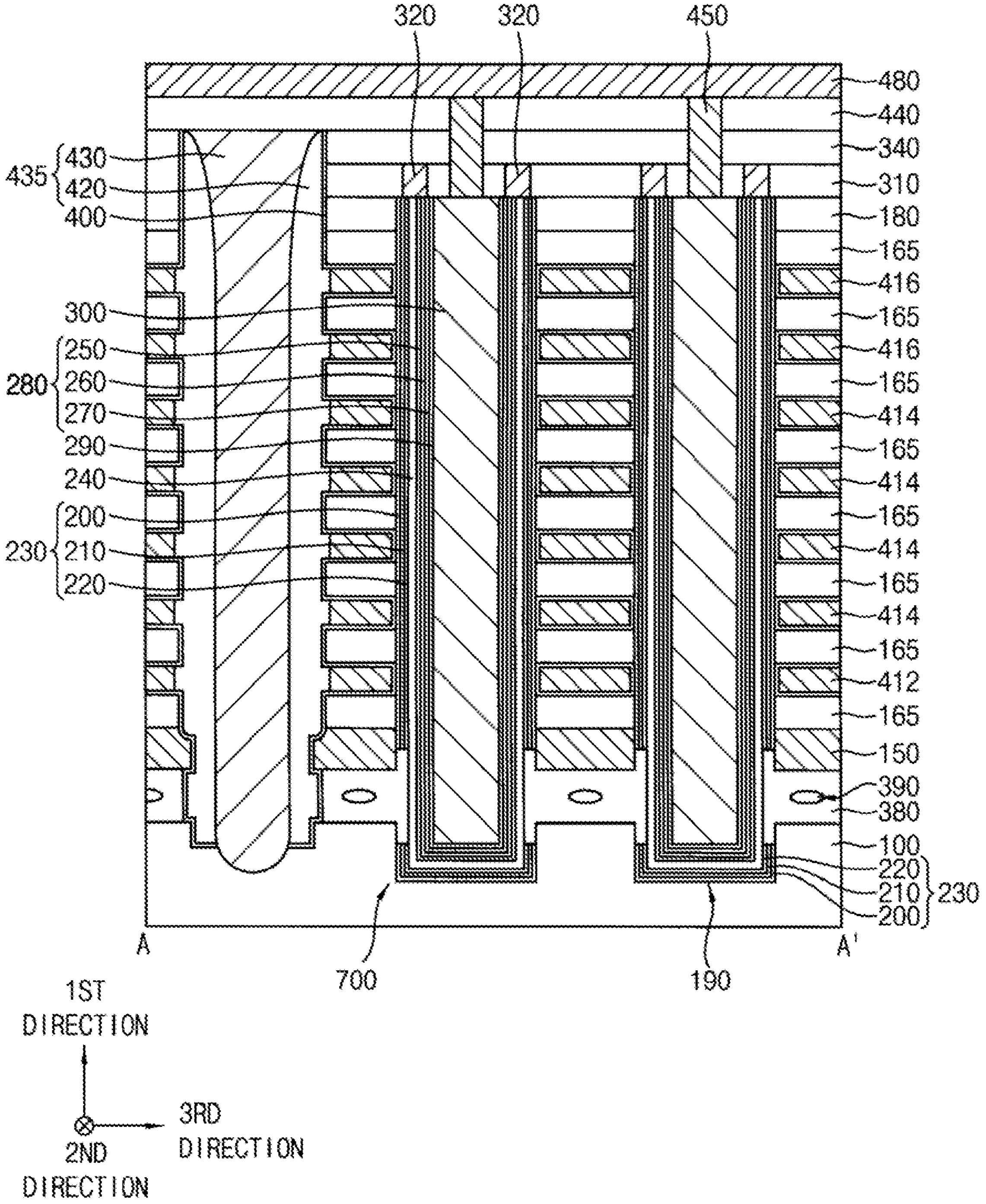
Figure 4:
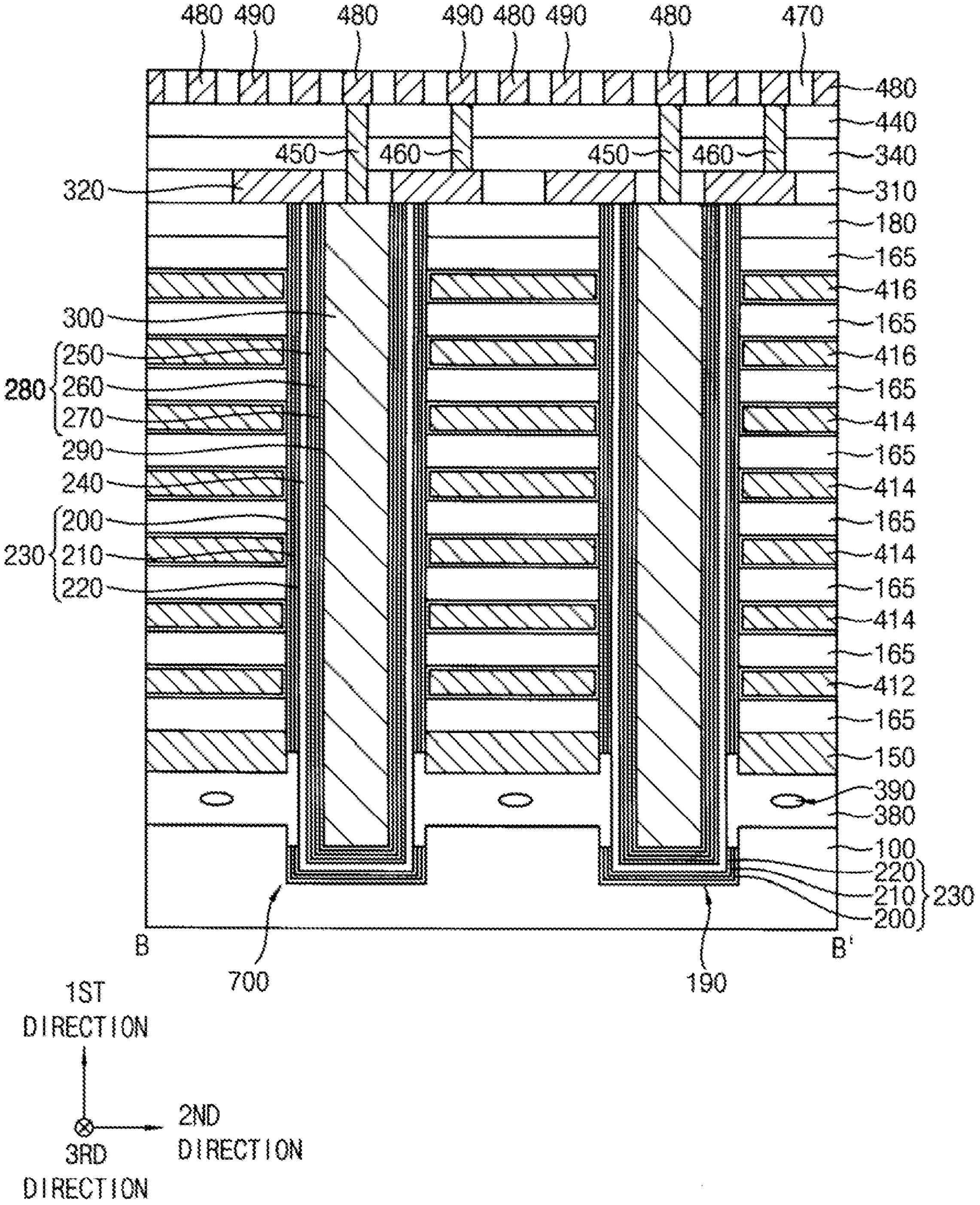

FIGS. 1 to 4 are plan views and cross-sectional views illustrating a vertical non-volatile memory device in accordance with an example embodiment. Particularly, FIGS. 1 and 2 are plan views, with FIG. 2 being an enlarged view of a region X of FIG. 1. FIG. 3 is a cross-sectional view taken along a line A-A' of FIG. 1. FIG. 4 is a cross-sectional view taken along a line B-B' of FIG. 1.

Referring to FIGS. 1 to 4, a vertical non-volatile memory device according to the present example embodiment may include a first substrate 100. The first substrate 100 may have thereon a pillar structure 700, a gate electrode structure, a conductive pad 320, first and second contact plugs 450 and 460, and first and second bit lines 480 and 490. The vertical non-volatile memory device may further include a channel connection pattern 380, a support layer 150, a support pattern (not shown), an insulation pattern 165, a division structure 435, a division layer 330, a third blocking layer 400, and first to fifth insulating interlayers 180, 310, 340, 440 and 470.

The first substrate 100 may include silicon, germanium, silicon-germanium or a group III-V compound such as GaP, GaAs, GaSb, etc. In an example embodiment, the first substrate 100 may be a silicon-on-insulator (SOI) substrate or a germanium-on-insulator (GOI) substrate.

The pillar structure 700 may be formed in a channel hole 190 extending through a mold having gate electrodes 412, 414, and 416 alternately stacked with the insulation pattern 165 in the first direction on the first substrate 100. The channel hole 190 may extend upward through the first insulating interlayer 180 on the mold and downward to expose an upper surface of the first substrate 100. The pillar structure 700 may thus extend in the first direction. Referring to the plan view in the plane containing the second and third directions in FIG. 2, the channel hole 190, and thus the pillar structure 700, may have, e.g., a circular shape in a plan view, according to the shape of the channel hole 190.

The pillar structure 700 may include a channel 240, a first charge storage structure 230 covering an outer sidewall of the channel 240, a second charge storage structure 280 on an inner sidewall of the channel 240, a fourth blocking layer 290 on an inner sidewall of the second charge storage structure 280, and a fourth gate electrode 300 extending in the first direction. A sidewall and a bottom surface of the fourth gate electrode 300 may be covered by the fourth blocking layer 290.

The channel 240 may extend in the first direction and may have a cup-like shape, e.g., having a sidewall continuously connected to a bottom portion. The channel 240 may include, e.g., undoped single crystalline silicon or single crystalline silicon doped with impurities.

As shown in FIG. 1, a plurality of the channels 240 may be arranged in the second and third directions to define a channel array. In an example embodiment, the channel array may include a first channel column (or column of channels) **240*a* including first channels disposed in the second direction, and a second channel column 240*b* including second channels disposed in the second direction and being spaced apart from the first channel column 240*a* in the third direction. The first channels included in the first channel column 240*a* may be arranged to have acute angles with the second direction or the third direction from the second channels included in the second channel column 240*b***. Thus, the first and second channels may be arranged in a zigzag pattern.

The first and second channel columns **240*a* and 240*b* may be alternately and repeatedly disposed in the third direction. In an example embodiment, five first channel columns 240*a* and four second channel columns 240*b*** may be alternately disposed in the third direction to form a channel block. The channel array may include a plurality of channel blocks spaced apart from each other in the third direction.

The number of the channel columns included in one channel block may be varied. Hereinafter, four channel columns disposed in the third direction in one channel block may be referred to as first, second, third and fourth channel columns **240*a*, 240*b*, 240*c*, and 240*d*, respectively, in this order. Also, one channel column at a central position in the third direction in the channel block may be referred to as a fifth channel column 240*e*. Also, the other four channel columns disposed in the third direction in the channel block may be referred to as the first, second, third and fourth channel columns 240*a*, 240*b*, 240*c*, and 240*d***, respectively, again in this order.

The first charge storage structure 230 may include an upper portion, which extends in the first direction to cover most of an outer sidewall of the channel 240 and may have a cylindrical shape, and a lower portion, which covers a bottom surface and a lower outer sidewall of the channel 240, forming a cup-like shape on the first substrate. Each of the upper and lower portions of the first charge storage structure 230 may include the channel 240, and a first tunnel insulation layer 220, a first charge storage layer 210, and a first blocking layer 200 sequentially stacked from the outer sidewall of the channel 240 and/or the bottom surface of the channel 240.

The second charge storage structure 280 may extend in the first direction and may also have a cup-like shape. The second charge storage structure 280 may include a second tunnel insulation layer 250, a second charge storage layer 260, and a second blocking layer 270 sequentially stacked from the inner sidewall of the channel 240.

Each of the first and second tunnel insulation layers 220 and 250 may include an oxide, e.g., silicon oxide. Each of the first and second charge storage layers 210 and 260 may include a nitride, e.g., silicon nitride. Each of the first and second blocking layers 200 and 270 may include an oxide, e.g., silicon oxide.

The fourth blocking layer 290 may extend in the first direction and may have a cup-like shape. The fourth blocking layer 290 may include a metal oxide, e.g., aluminum oxide, hafnium oxide, etc.

A sidewall and a bottom surface of the fourth gate electrode 300 may be covered by the fourth blocking layer 290. The fourth gate electrode 300 may include a metal, e.g., tungsten, copper, aluminum, titanium, tantalum, etc.

The gate electrode structure may include a plurality of gate electrodes 412, 414, and 416 spaced apart from each other in the first direction, each of which may surround the pillar structure 700. Each of the gate electrodes 412, 414, and 416 may extend in the second direction, and lengths in the second direction of the gate electrodes 412, 414, and 416 may decrease from a lowermost one to an uppermost one such that the gate electrode structure has a staircase shape.

The gate electrode structure may include the first to third gate electrodes 412, 414, and 416. The first gate electrode 412 may serve as a ground selection line (GSL). The second gate electrode 414 may serve as a word line. The third gate electrode 416 may serve as a string selection line (SSL). Each of the first to third gate electrodes 412, 414, and 416 on the outer sidewall of the channel 240 may be referred to as front gate (FG). The fourth gate electrode 300 on the inner sidewall of the channel 240 may be referred to as a back gate (BG).

Each of the first to third gate electrodes 412, 414, and 416 may be formed at one or more than one levels. In an example embodiment, the first gate electrode 412 may be formed at a lowermost level, the third gate electrode 416 may be formed at an uppermost level and one level directly under the uppermost level, and the second gate electrode 414 may be formed at a plurality of levels between the first and third gate electrodes 412 and 416.

Each of the first to third gate electrodes 412, 414, and 416 may include a gate conductive pattern along with a gate barrier pattern that covers lower and upper surfaces and a sidewall of the gate conductive pattern. The gate conductive pattern may include a low resistance metal, e.g., tungsten, titanium, tantalum, platinum, etc. The gate barrier pattern may include a metal nitride, e.g., titanium nitride, tantalum nitride, etc.

Lower and upper surfaces and a sidewall facing the pillar structure 700 of each of the gate electrodes 412, 414, and 416 may be covered by the third blocking layer 400 (see FIG. 3). The third blocking layer 400 may include a metal oxide, e.g., aluminum oxide, hafnium oxide, etc., and may also cover sidewalls of the insulation pattern 165, the support layer 150, the channel connection pattern 380, and the first to third insulating interlayers 180, 310, and 340.

The insulation pattern 165 may be formed between neighboring ones of the gate electrodes 412, 414, and 416. The gate electrodes 412, 414, and 416 and the insulation pattern 165 may form the mold having a staircase shape including step layers arranged in the second direction. The insulation pattern 165 may include an oxide, e.g., silicon oxide.

The gate electrode structure may extend in the second direction. A plurality of gate electrode structures may be arranged in the third direction. The gate electrode structures may be spaced apart from each other by the division structure 435 extending in the second direction.

The division structure 435 may include a common source line (CSL) 430 extending through the mold in the first direction, the insulation pattern 165, the channel connection pattern 380, the support layer 150, and the first to third insulating interlayers 180, 310, and 340. The division structure 435 may also include a second spacer 420 on each of opposite sidewalls of the CSL 430 in the third direction. The CSL 430 may include a metal, a metal nitride, a metal silicide, etc. The second spacer 420 may include an oxide, e.g., silicon oxide.

The division layer 330 may extend in the second direction at a central portion of each channel block in the third direction, and may extend through upper portions of the channels 240 included in the fifth channel column 240*e*. Thus, the channels 240 included in the fifth channel column may serve as dummy channels.

In an example embodiment, the division layer 330 may extend through the upper portions of the channels 240, and may also extend through the first and second insulating interlayers 180 and 310, ones of the insulation layers 160 at upper two levels, respectively, and the third gate electrodes 416. Thus, the third gate electrodes 416 at upper two levels, respectively, may be divided in the third direction by the division layer 330.

The channel connection pattern 380 may be formed under the first gate electrode 412, i.e., between the first gate electrode 412 and the first substrate 100. The channel connection pattern 380 may contact a lower outer sidewall of each of the channels 240, i.e., a portion of an outer sidewall of each of the channels 240 between the lower and upper portions of the first charge storage structure 230 that is not covered by the first charge storage structure 230. Thus, the channels 240 included in the same channel block may be connected with each other. The channel connection pattern 380 may include polysilicon doped with, e.g., n-type impurities. The channel connection pattern 380 may have an air gap 390 therein. The support layer 150 may be formed between the channel connection pattern 380 and the first gate electrode 412.

In an implementation (not shown), a portion of the support layer 150 may extend through the channel connection pattern 380 to contact an upper surface of the first substrate 100, and this may be referred to as a support pattern. A plurality of support patterns may be arranged in the second and third directions, and may have various layouts. Some of the support patterns may extend in the second direction or third direction.

In an example embodiment, the conductive pad 320 may extend through the second insulating interlayer 310. As illustrated in FIG. 2, the conductive pad 320 may have a ring shape, in a plan view, that overlaps the channel 240 in the first direction but does not overlap the fourth gate electrode 300 in the first direction. The conductive pad 320 may have, for example, a ring shape including an elliptical outer contour and a circular inner contour, in a plan view. In another implementation, referring to FIG. 10, the conductive pad 320 may have a ring shape including a rectangular outer contour and a circular inner contour, in a plan view. The conductive pad 320 having the ring shape may contact the channel 240, and may further include a portion not overlapping the pillar structure 700 in the first direction.

The conductive pad 320 may include, e.g., single crystalline silicon doped with impurities.

The first contact plug 450 may extend through the second to fourth insulating interlayers 310, 340, and 440 to contact an upper surface of the fourth gate electrode 300. In an example embodiment, the first contact plug 450 may contact an upper surface of ones of the fourth gate electrodes 300 included in each of the pillar structures 700 except for ones of the pillar structures 700 including the channels 240 of the fifth channel column 240*e*.

As shown in FIG. 4, the second contact plug 460 may extend through the third and fourth insulating interlayers 340 and 440 to contact an upper surface of the conductive pad 320. In an example embodiment, the second contact plug 460 may contact an upper surface of ones of the conductive pads 320 on each of the pillar structures 700 except for ones of the pillar structures 700 including the channels 240 of the fifth channel column 240*e*. In an example embodiment, the second contact plugs 460 may be arranged to be symmetrical with respect to the division layer 330 extending in the second direction.

Each of the first and second bit lines 480 and 490 may extend through the fifth insulating interlayer 470 in the third direction. A plurality of first bit lines 480 may be spaced apart from each other in the second direction. A plurality of second bit lines 490 may be spaced apart from each other in the second direction. Each of the first bit lines 480 may commonly contact upper surfaces of the first contact plugs 450 disposed in the third direction. Each of the second bit lines 490 may commonly contact upper surfaces of the second contact plugs 460 disposed in the third direction.

In an example embodiment, two second bit lines 490 may be disposed between neighboring ones of the first bit lines 480 in the second direction.

The first insulating interlayer 180 may be formed on the first substrate 100 and an uppermost one of the insulation patterns 165 to cover the mold. The second to fifth insulating interlayers 310, 340, 440, and 470 may be sequentially stacked on the first insulating interlayer 180. The first to fifth insulating interlayers 180, 310, 340, 440, and 470 may include an oxide, e.g., silicon oxide, and may be merged with each other.

As described above, in the vertical non-volatile memory device according to the present example embodiment, the first and second charge storage structures 230 and 280 may be formed on the outer and inner sidewalls of the channel 240, respectively. The first charge storage structure 230 may be surrounded by each of the first to third gate electrodes 412, 414, and 416. The fourth gate electrode 300 may be adjacent the second charge storage structure 280. Thus, memory cells may be formed, each of which may include the fourth gate electrode 300 and the second charge storage 280 in addition to each of the second gate electrodes 414, the channel 240, and the first charge storage structure 230. Accordingly, in addition to a threshold voltage that may be obtained by the FG, i.e., each of the second gate electrodes 414 through the channel 240 and the first charge storage structure 230 in each of the memory cells, a threshold voltage may be further obtained by the BG, i.e., the fourth gate electrodes 300 through the channel 240 and the second charge storage structure 280. Thus, each of the memory cells may easily have the characteristics of MLCs.

FIGS. 5 to 18 are plan views and cross-sectional views illustrating a method of manufacturing a vertical non-volatile memory device in accordance with an example embodiment. Particularly, FIGS. 7-8, 10-12, and 17 are plan views. FIGS. 8 and 10 are enlarged cross-sectional views of a region X of FIG. 7. FIGS. 5-6, 9, 13-16, and 18 are cross-sectional views taken along lines A-A' of corresponding plan views, respectively.

Figure 5:
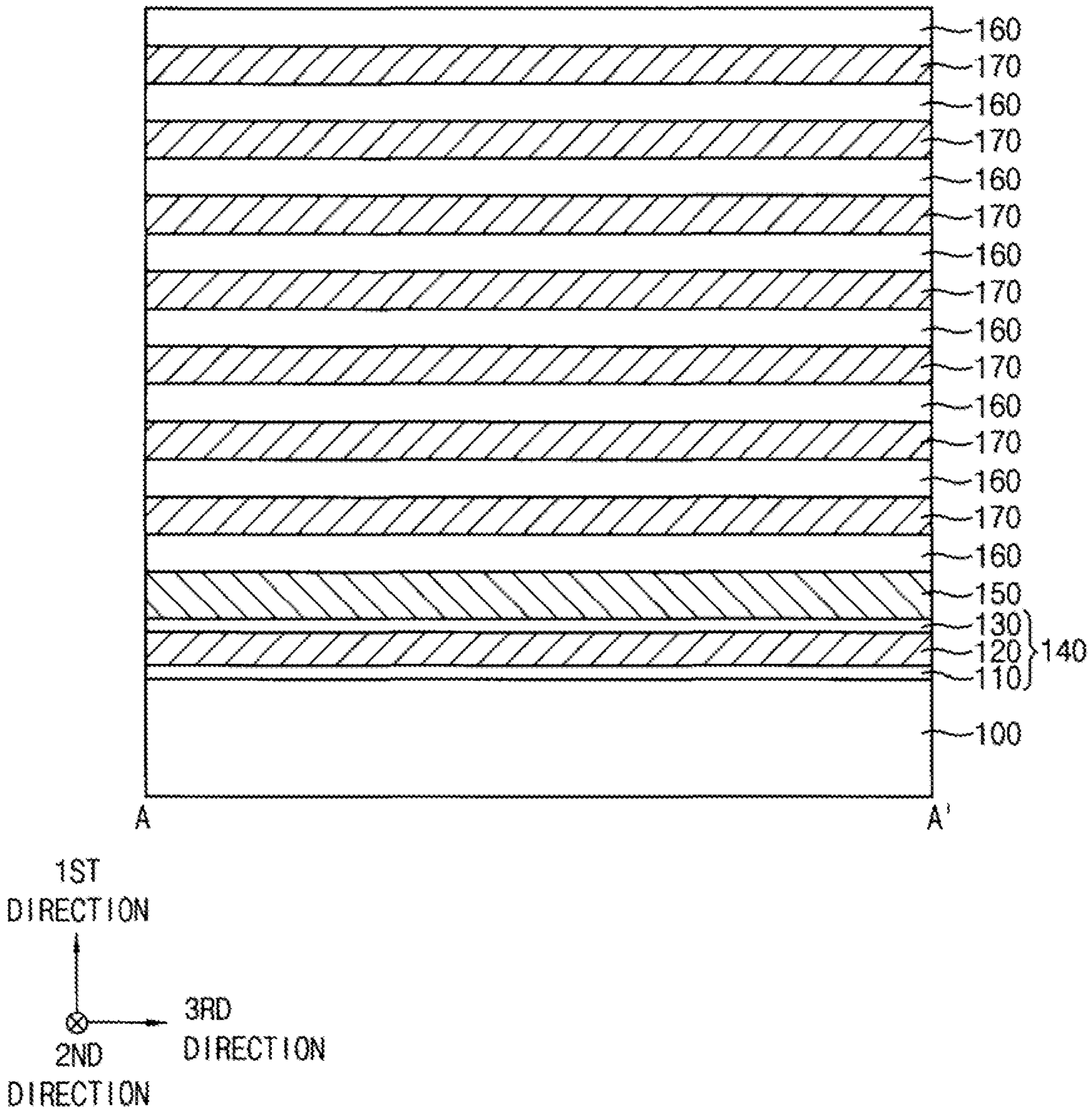
FIGS. 5 to 18 are plan views and cross-sectional views illustrating a method of manufacturing a vertical non-volatile memory device in accordance with an example embodiment.

Referring to FIG. 5, a sacrificial layer structure 140 and a support layer 150 may be formed on a first substrate 100. An insulation layer 160 and a fourth sacrificial layer 170 may be alternately and repeatedly stacked on the support layer 150 to form a mold layer.

The sacrificial layer structure 140 may include first to third sacrificial layers 110, 120, and 130 sequentially stacked in the first direction. Each of the first and third sacrificial layers 110 and 130 may include an oxide, e.g., silicon oxide. The second sacrificial layer 120 may include a nitride, e.g., silicon nitride.

The support layer 150 may include a material having an etching selectivity with respect to the first to third sacrificial layers 110, 120, and 130, e.g., polysilicon doped with n-type impurities.

In an implementation (not shown), the sacrificial layer structure 140 may be partially removed to form a first opening (not shown) exposing an upper surface of the first substrate 100 before forming the insulation layer 160. The support layer 150 may be formed on the first substrate 100 and the sacrificial layer structure 140 to at least partially fill the first opening, and thus a support pattern (not shown) may be formed in the first opening.

The insulation layer 160 may include an oxide, e.g., silicon oxide. The fourth sacrificial layer 170 may include a material having an etching selectivity with respect to the insulation layer 160, e.g., a nitride such as silicon nitride.

Figure 6:
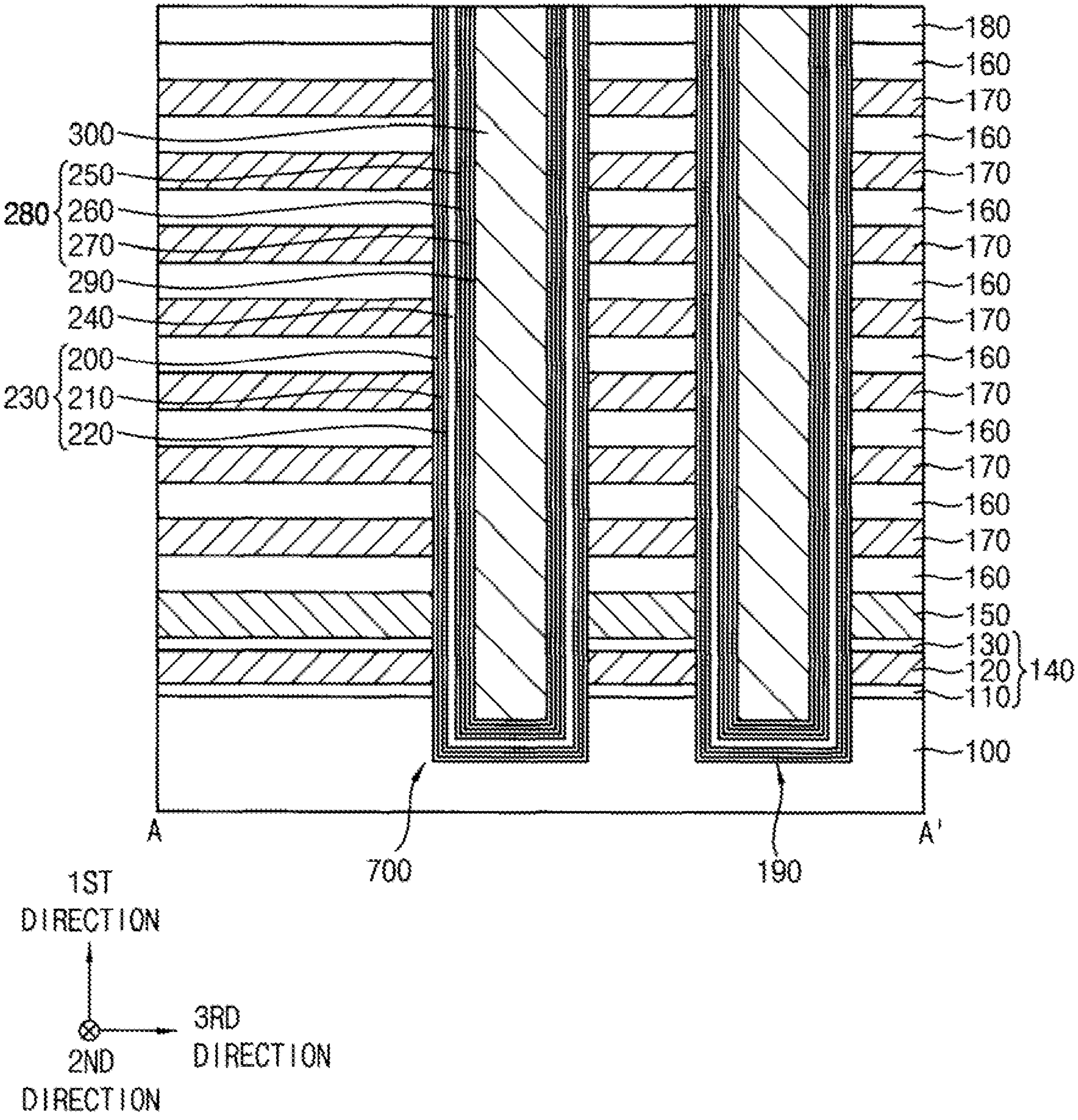

Referring to FIG. 6, a photoresist pattern (not shown) partially covering an uppermost one of the insulation layers 160 may be formed on the uppermost one of the insulation layers 160. The uppermost one of the insulation layers 160 and an uppermost one of the fourth sacrificial layers 170 may be etched using the photoresist pattern as an etching mask. Thus, one of the insulation layers 160 under the uppermost one of the fourth sacrificial layers 170 may be partially exposed. A trimming process for reducing an area of the photoresist pattern may be performed, and the uppermost one of the insulation layers 160, the uppermost one of the fourth sacrificial layers 170, the exposed one of the insulation layers 160, and one of the fourth sacrificial layers 170 thereunder may be etched again using the reduced photoresist pattern as an etching mask.

The etching process and the trimming process may be alternately and repeatedly performed to form a mold having a plurality of stepped layers each including the fourth sacrificial layer 170 and the insulation layer 160 sequentially stacked on the first substrate 100, and the stepped layers may form, e.g., a staircase shape arranged in the second direction.

A first insulating interlayer 180 may be formed on the first substrate 100 to cover the mold. A pillar structure 700 may be formed through the first insulating interlayer 180 and the mold on the first substrate 100. The pillar structure 700 may be formed by, e.g., the following processes.

The first insulating interlayer 180 and the mold may be etched by a dry etching process to form a channel hole 190 exposing an upper surface of the first substrate 100. A first charge storage structure 230, a channel 240, a second charge storage structure 280, and a fourth blocking layer 290 may be sequentially stacked on a sidewall of the channel hole 190, on the exposed upper surface of the first substrate 100, and on an upper surface of the first insulating interlayer 180. A fourth gate electrode 300 may be formed on the fourth blocking layer 290 to fill a remaining portion of the channel hole 190. The fourth gate electrode 300, the fourth blocking layer 290, the second charge storage structure 280, the channel 240, and the first charge storage structure 230 may be planarized until the upper surface of the first insulating interlayer 180 is exposed. Thus, the pillar structure 700 may be formed in the channel hole 190.

In an example embodiment, the dry etching process may be performed until the channel hole 190 exposes the upper surface of the first substrate 100. In an example embodiment, the channel hole 190 may extend through an upper portion of the first substrate 100. In an example embodiment, a plurality of channel holes 190 may be formed in each of the second and third directions, and thus a channel hole array may be defined.

In an example embodiment, the first charge storage structure 230 may include a first blocking layer 200, a first charge storage layer 210, and a first tunnel insulation layer 220 sequentially stacked on the sidewall of the channel hole 190 and the exposed upper surface of the first substrate 100. The first charge storage structure 230 may contact an outer sidewall of the channel 240. The second charge storage structure 280 may include a second tunnel insulation layer 250, a second charge storage layer 260, and a second blocking layer 270 sequentially stacked on an inner sidewall of the channel 240. The second charge storage structure may contact a sidewall and a bottom surface of the fourth gate electrode 300.

Figure 7:
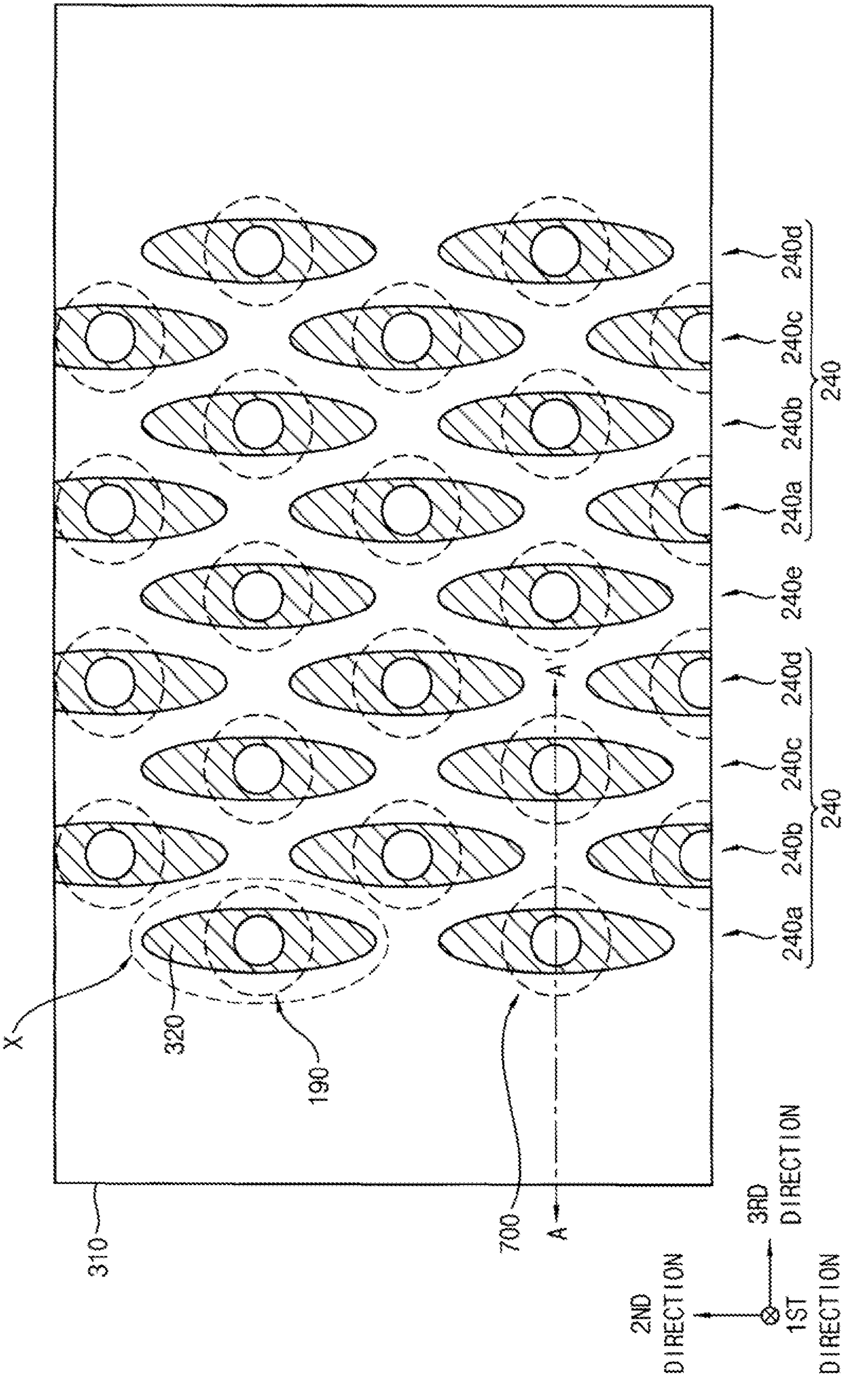
Figure 8:
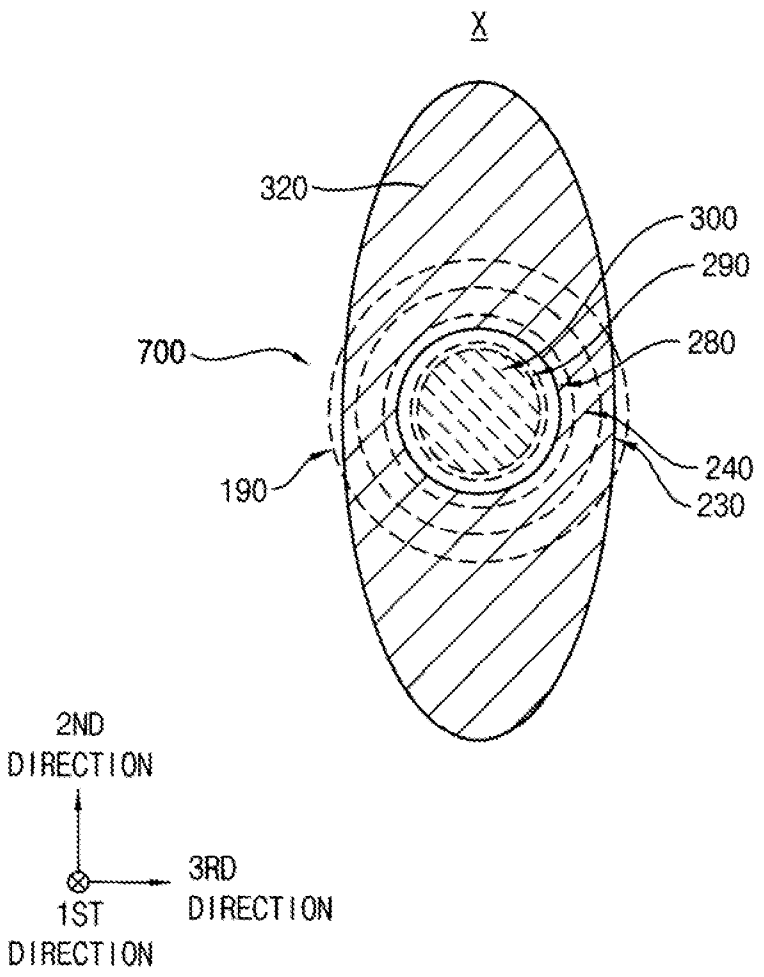
Figure 9:
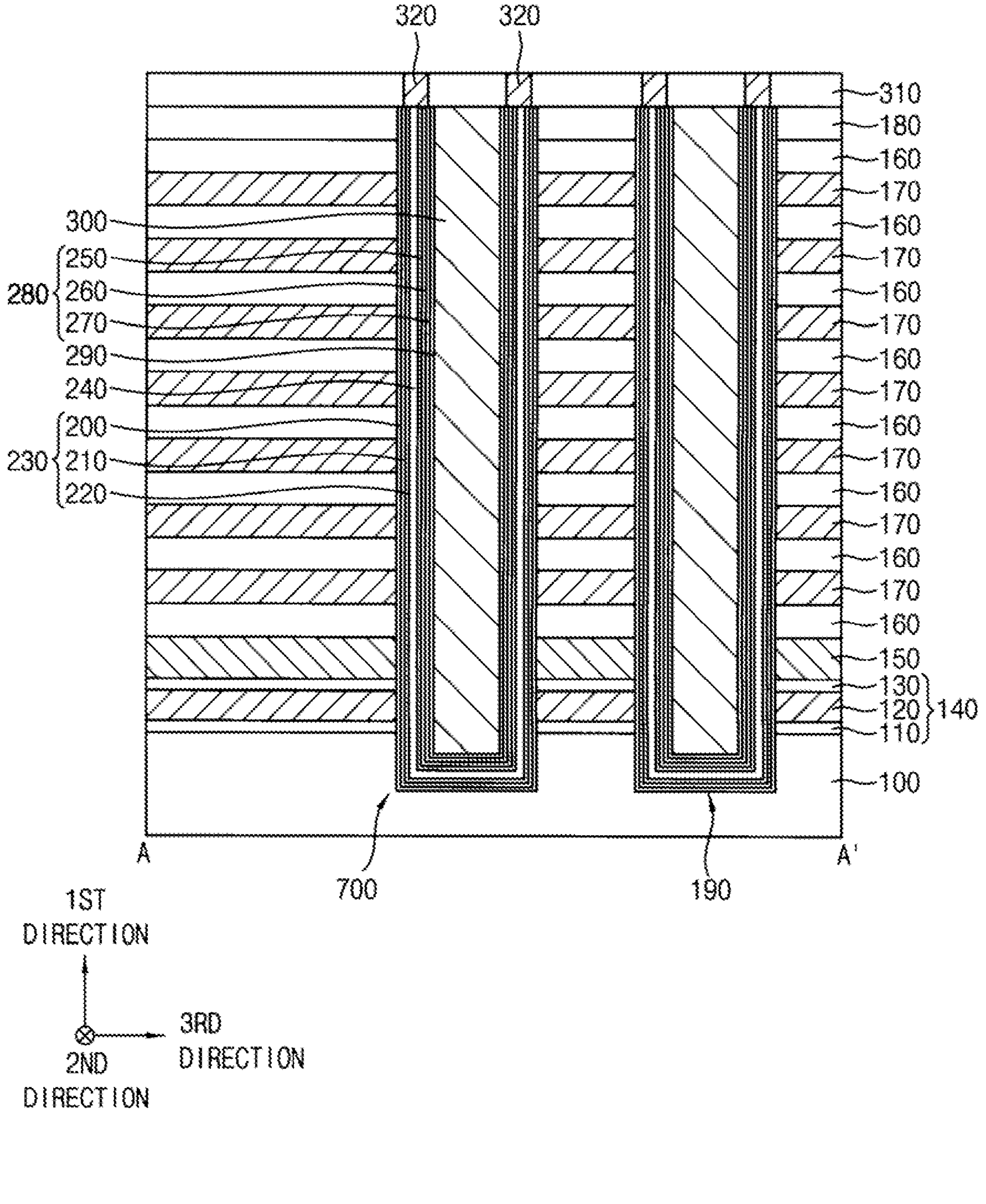
Figure 10:
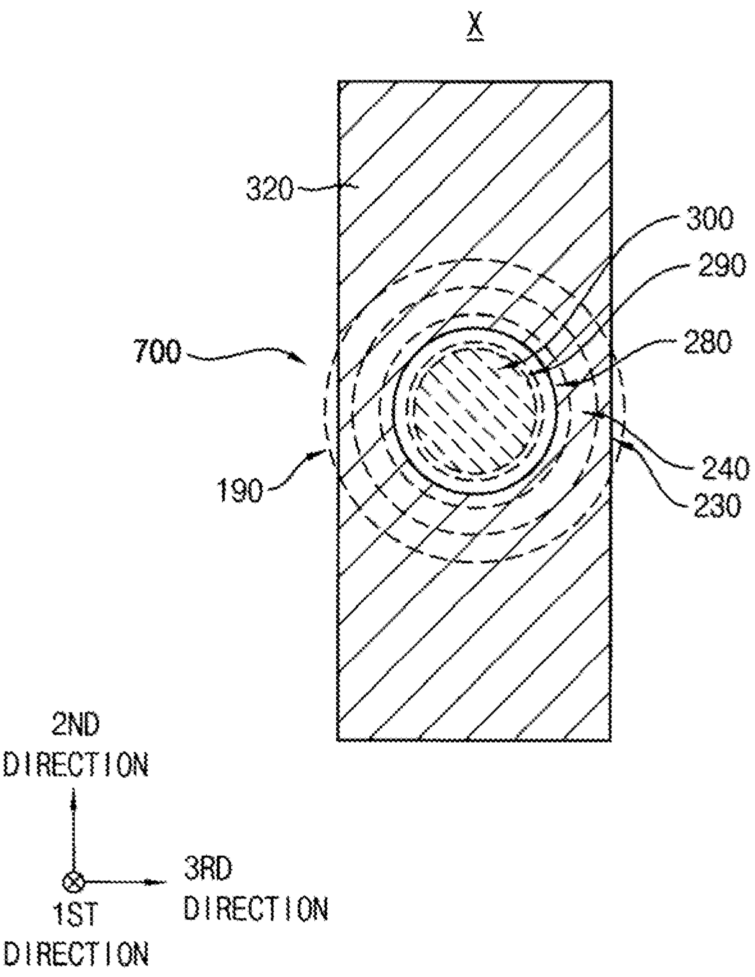

Referring to FIGS. 7 to 9, a second insulating interlayer 310 may be formed on the first insulating interlayer 180 and the pillar structure 70. A conductive pad 320 may be formed through the second insulating interlayer 310 to partially contact the pillar structure 700.

The conductive pad 320 may have, for example, a ring shape in a plan view, and may overlap the channel 240 in the first direction without overlapping the fourth gate electrode 300 in the first direction. The conductive pad 320 may have, for example, an elliptical outer contour and a circular inner contour in a plan view. In another example embodiment, referring to FIG. 10, the conductive pad 320 may have a rectangular outer contour and a circular inner contour in a plan view.

Figure 11:
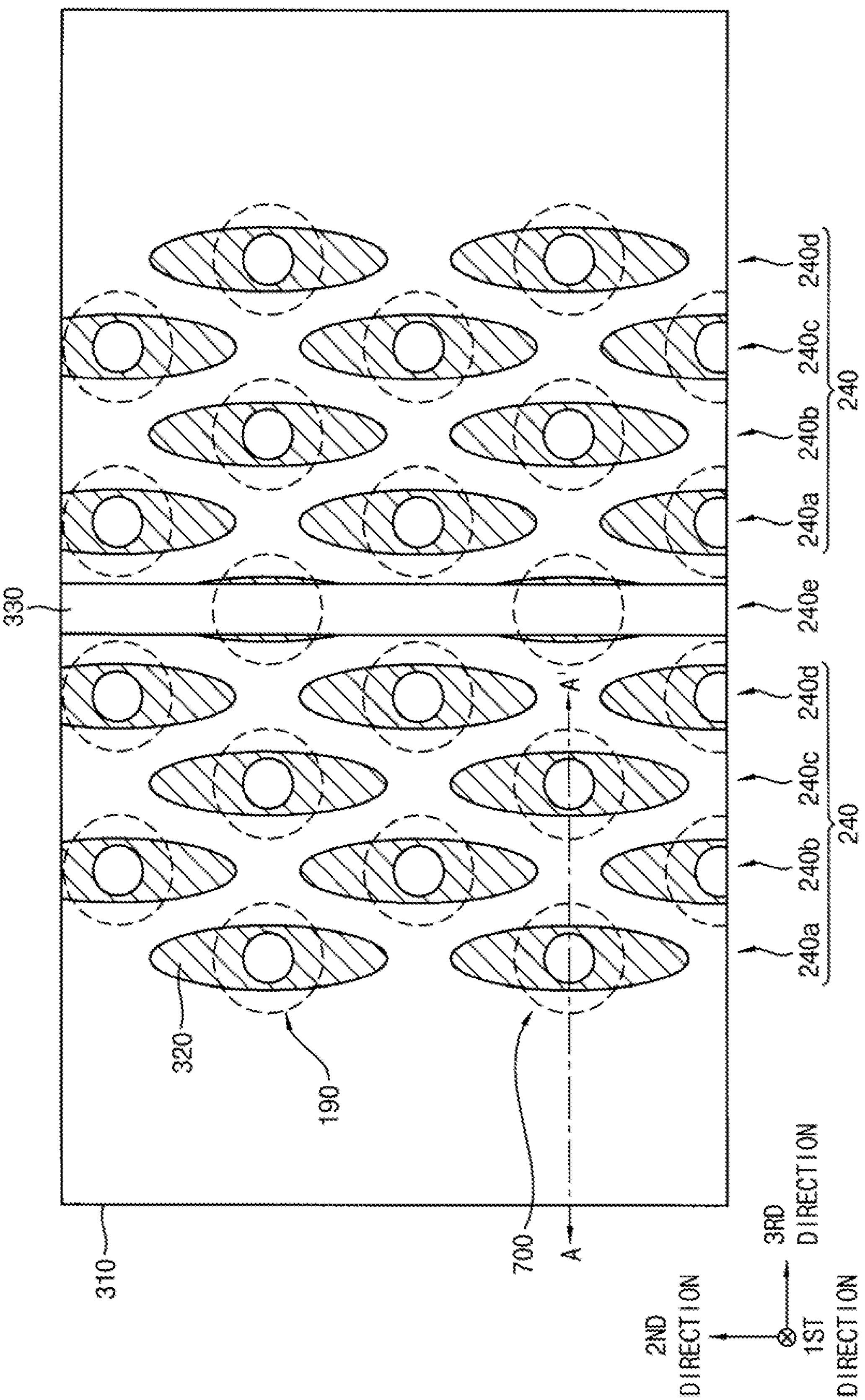

Referring to FIG. 11, a division layer 330 may be formed through the first and second insulating interlayers 180 and 310, and through portions of the insulation layer 160 and the fourth sacrificial layer 170. The division layer 330 may be formed by partially etching the first and second insulating interlayers 180 and 310, the insulation layer 160, the fourth sacrificial layer 170, the conductive pad 320, and the pillar structure 700 through, e.g., a dry etching process, to form a first recess (not shown), and then filling in the first recess.

Figure 12:
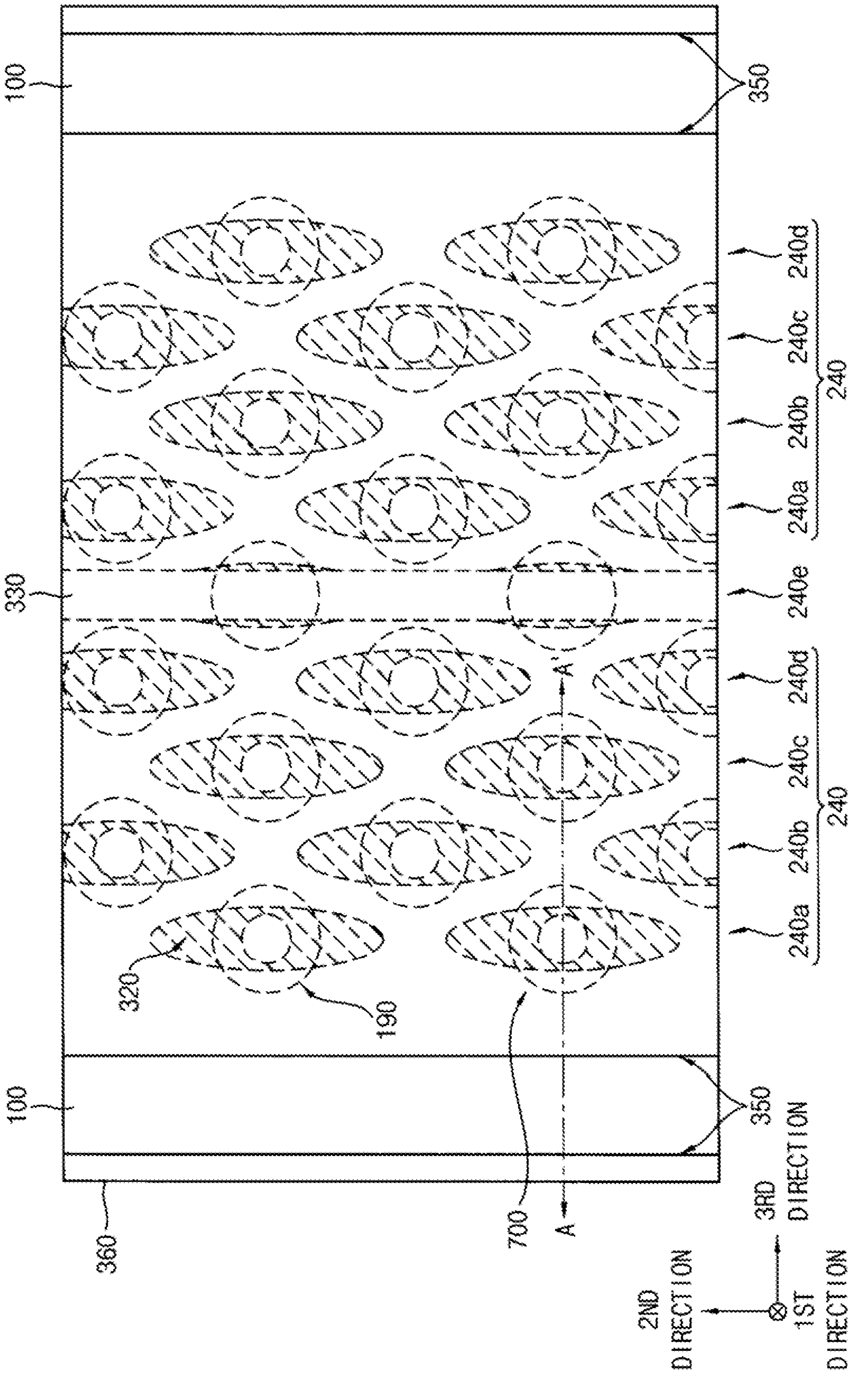
Figure 13:
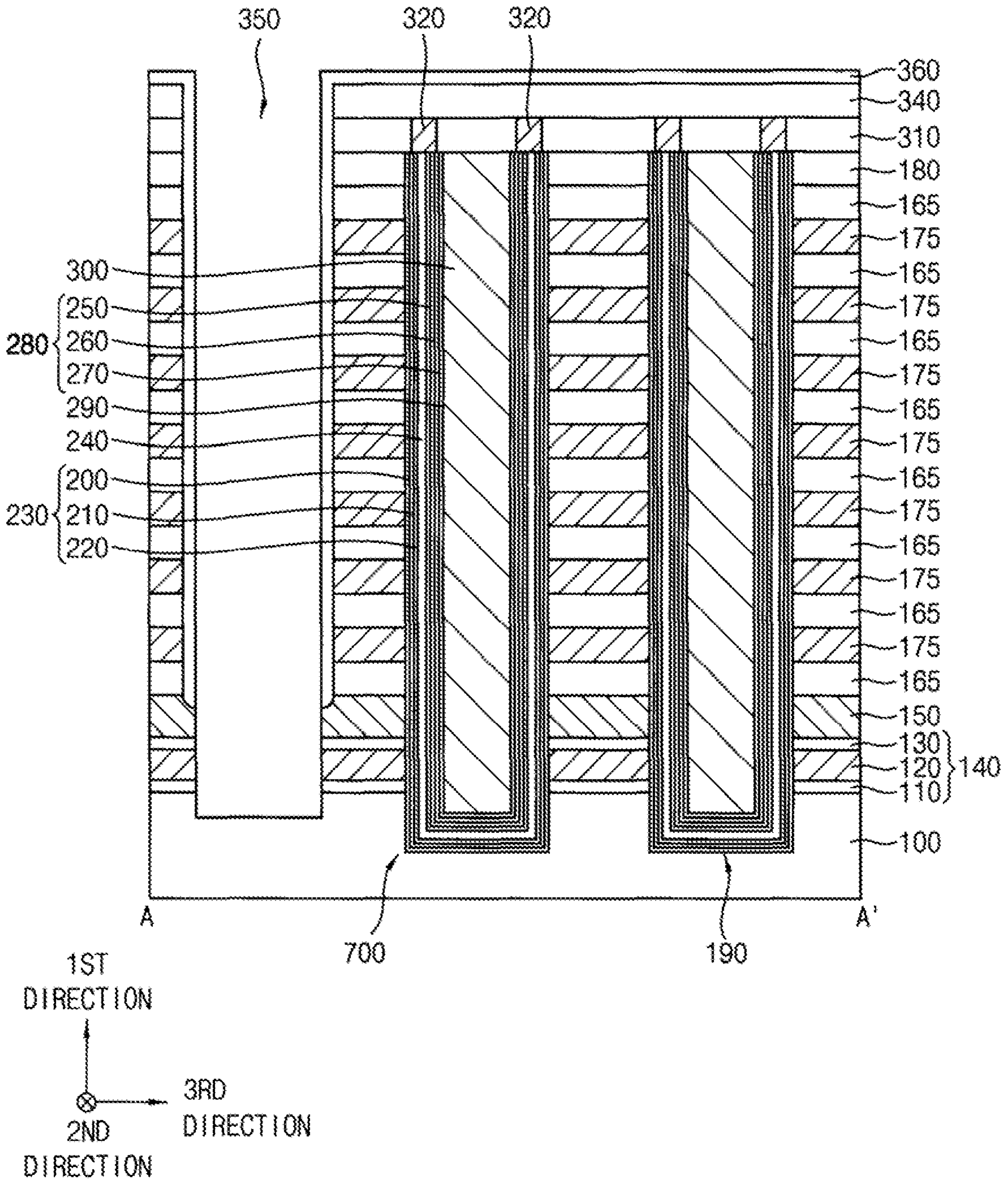

Referring to FIGS. 12 and 13, a third insulating interlayer 340 may be formed on the second insulating interlayer 310, the conductive pad 320, and the division layer 330.

A second opening 350 may be formed through the first to third insulating interlayers 180, 310, and 340 and the mold by a dry etching process on the first substrate 100. The dry etching process may be performed until the second opening 350 exposes an upper surface of the support layer 150 or the support pattern. In an implementation, the second opening 350 may extend into an upper portion of the support layer 150 or the support pattern. As the second opening 350 is formed, the insulation layer 160 and the fourth sacrificial layer 170 included in the mold may be exposed by the second opening 350.

In an example embodiment, the second opening 350 may extend in the second direction on the first substrate 100, and a plurality of second openings 350 may be formed in the third direction. As the second opening 350 is formed, the insulation layer 160 may be divided into a plurality of insulation patterns 165, each of which may extend in the second direction, spaced apart from each other in the third direction, and the fourth sacrificial layer 170 may be divided into a plurality of fourth sacrificial patterns 175, each of which may extend in the second direction, spaced apart from each other in the third direction.

A first spacer layer may be formed on a sidewall of the second opening 350 and the third insulating interlayer 340. A portion of the first spacer layer on the upper surface of the support layer 150 or the support pattern may be removed by, e.g., an anisotropic etching process, to form a first spacer 360, and thus the upper surface of the support layer 150 or the support pattern may be partially exposed.

The exposed portion of the support layer 150 or the support pattern and a portion of the sacrificial layer structure 140 thereunder may be removed to enlarge the second opening 350 downwardly. Thus, the second opening 350 may expose an upper surface of the first substrate 100, and may further extend into an upper portion of the first substrate 100.

In an example embodiment, the first spacer 360 may include, e.g., undoped polysilicon.

When the sacrificial layer structure is partially removed, the sidewall of the second opening 350 may be covered by the first spacer 360, and thus the insulation pattern 165 and the fourth sacrificial pattern 175 included in the mold may not be removed.

Figure 14:
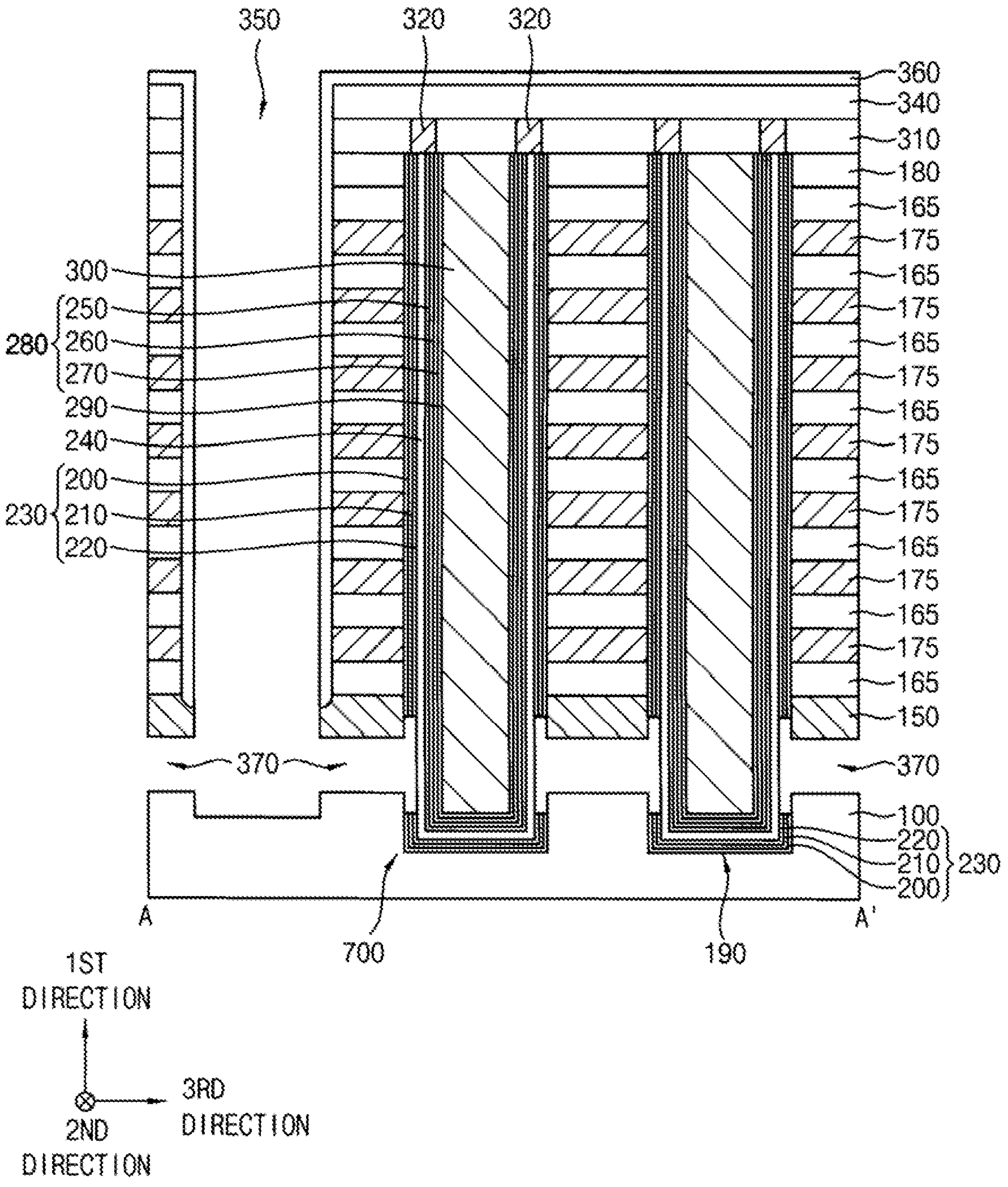

Referring to FIG. 14, the sacrificial layer structure 140 may be removed through the second opening 350 by, e.g., a wet etching process, and thus a first gap 370 may be formed. When the sacrificial layer structure 140 is removed, a portion of the first charge storage structure 230 adjacent thereto may be also removed, and thus a portion of an outer sidewall of the channel 240 may be exposed. The wet etching process may be performed using, e.g., fluoric acid (HF) and/or phosphoric acid ($H_3PO_4$) as an etchant. As the first gap 370 is formed, the first charge storage structure 230 may be divided into a lower portion on the first substrate 100 and an upper portion in the mold, which may be spaced apart from the lower portion in the first direction. When the first gap 370 is formed by the wet etching process, the support layer 150 and the support pattern may not be removed, and thus the mold may not collapse.

Figure 15:
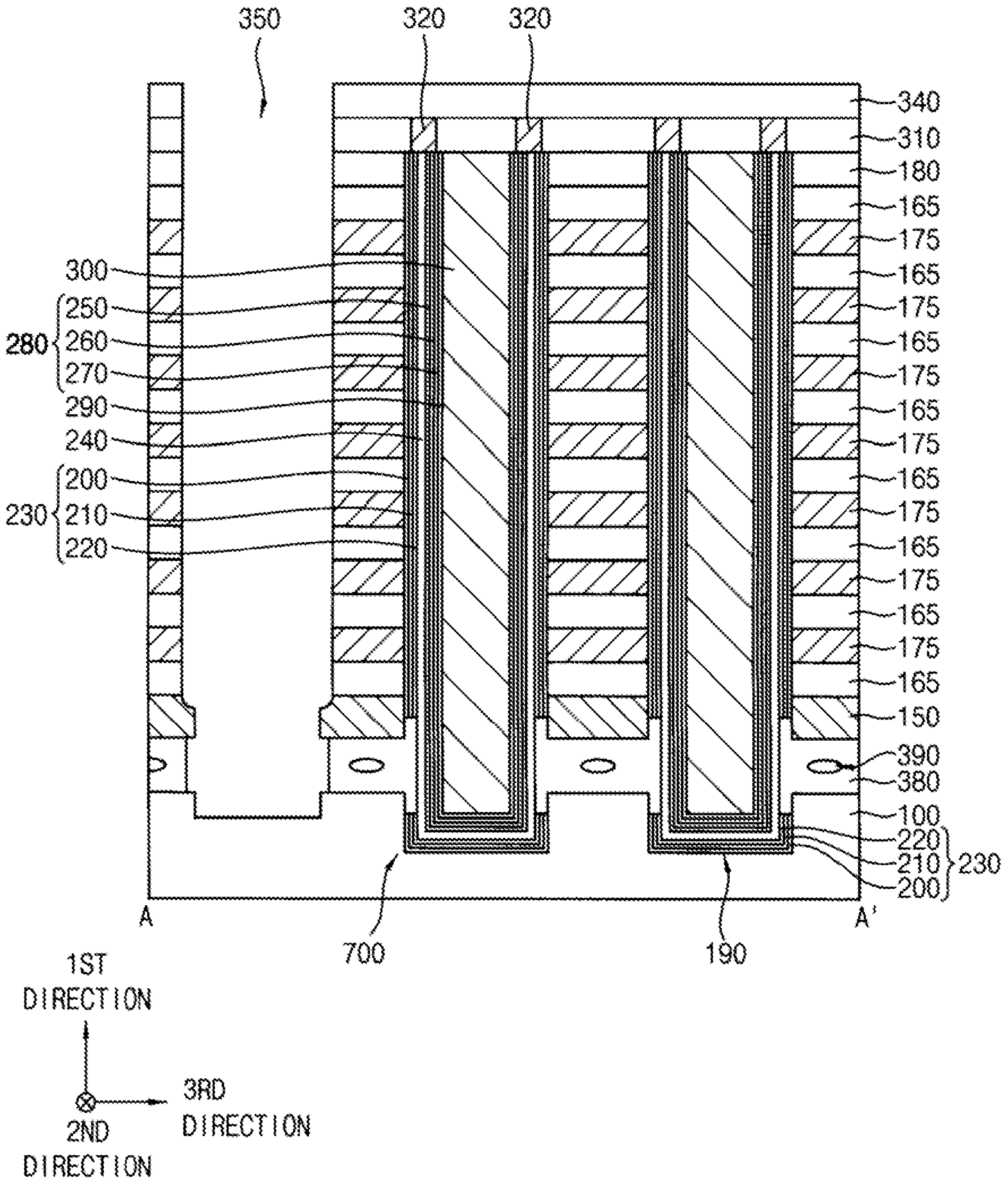

Referring to FIG. 15, the first spacer 360 may be removed. A channel connection layer may be formed on a sidewall of the second opening 350 and in the first gap 370. A portion of the channel connection layer in the second opening 350 may be removed by, e.g., an etch back process to form a channel connection pattern 380 in the first gap 370. As the channel connection pattern 380 is formed, the channels 240 forming the channel array, particularly, one channel block may be connected with each other. The channel connection pattern 380 may include an air gap 390 therein.

Figure 16:
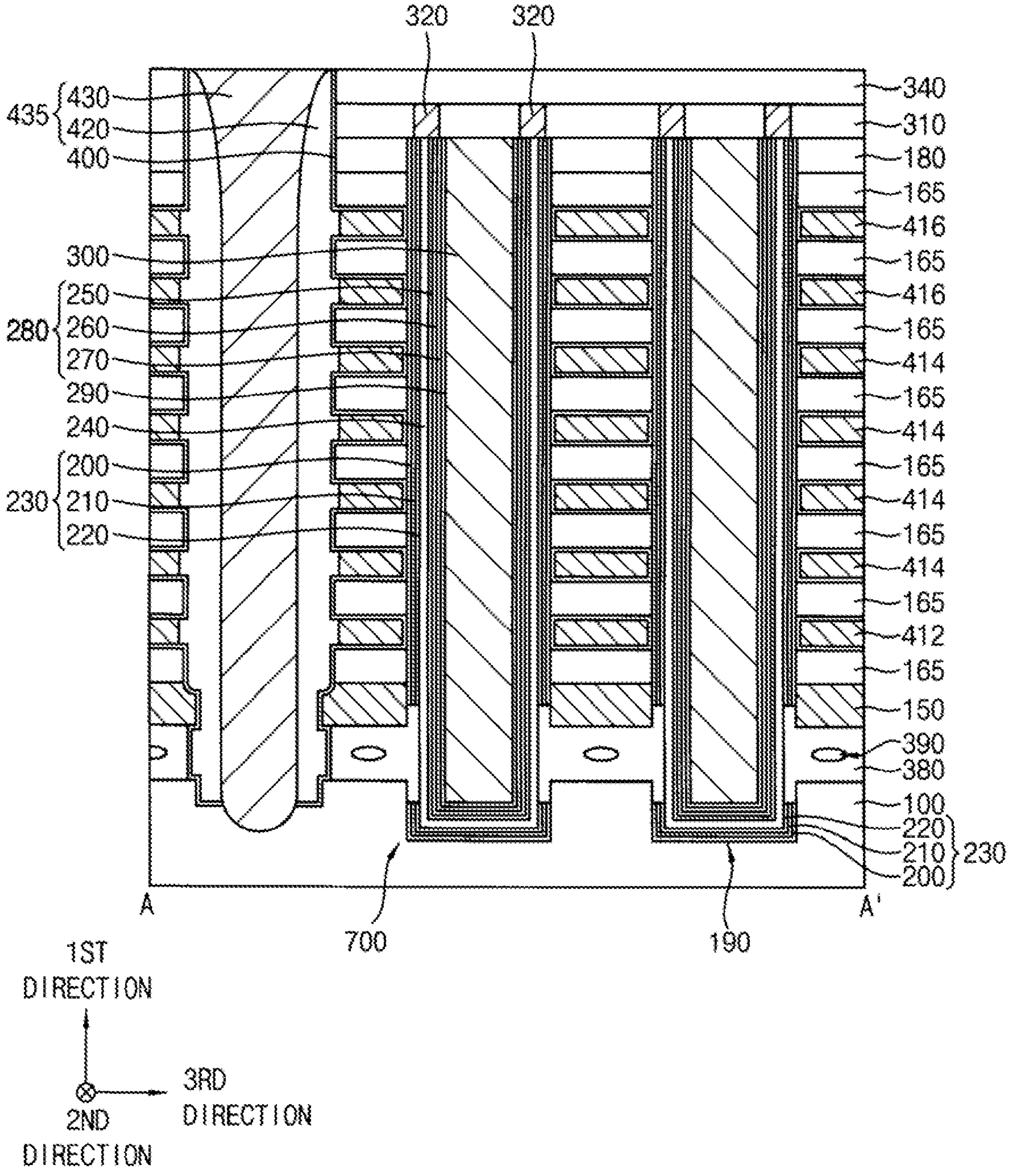

Referring to FIG. 16, the fourth sacrificial patterns 175 exposed by the second opening 350 may be removed to form a second gap between the insulation patterns 165 at the plurality of levels, respectively. A portion of an outer sidewall of the first blocking layer 200 may be exposed by the second gap. In an example embodiment, the fourth sacrificial patterns 175 may be removed by a wet etching process using, e.g., phosphoric acid ($H_3PO_4$) or fluoric acid (HF).

A third blocking layer 400 may be formed on the exposed portion of the outer sidewall of the first blocking layer 200, inner walls of the second gaps, surfaces of the insulation patterns 165, a sidewall and a bottom surface of the support layer 150, a sidewall of the support pattern, a sidewall of the channel connection pattern 380, the upper surface of the first substrate 100, and an upper surface of the third insulating interlayer 340. A gate electrode layer may be formed on the third blocking layer 400. The gate electrode layer may include a gate barrier layer and a gate conductive layer sequentially stacked.

The gate electrode layer may be partially removed to form a gate electrode in each of the second gaps. In an example embodiment, the gate electrode layer may be partially removed by, e.g., a wet etching process.

In an example embodiment, the gate electrode may extend in the second direction, and a plurality of gate electrodes may be formed at a plurality of levels, respectively, to be spaced apart from each other in the first direction. Additionally, a plurality of gate electrodes may be formed in the third direction. Thus, the gate electrodes (each of which may extend in the second direction at the same level) may be spaced apart from each other in the third direction by the second opening 350. The gate electrode may include first, second, and third gate electrodes 412, 414, and 416.

A second spacer 420 may be formed on the sidewall of the second opening 350. A common source line (CSL) 430 may be formed to fill a remaining portion of the second opening 350.

In an example embodiment, the CSL 430 may extend in the second direction, and together with the second spacer 420 on the sidewall thereof, may form a division structure 435 that divides each of the first to third gate electrodes 412, 414, and 416 in the third direction.

Figure 17:
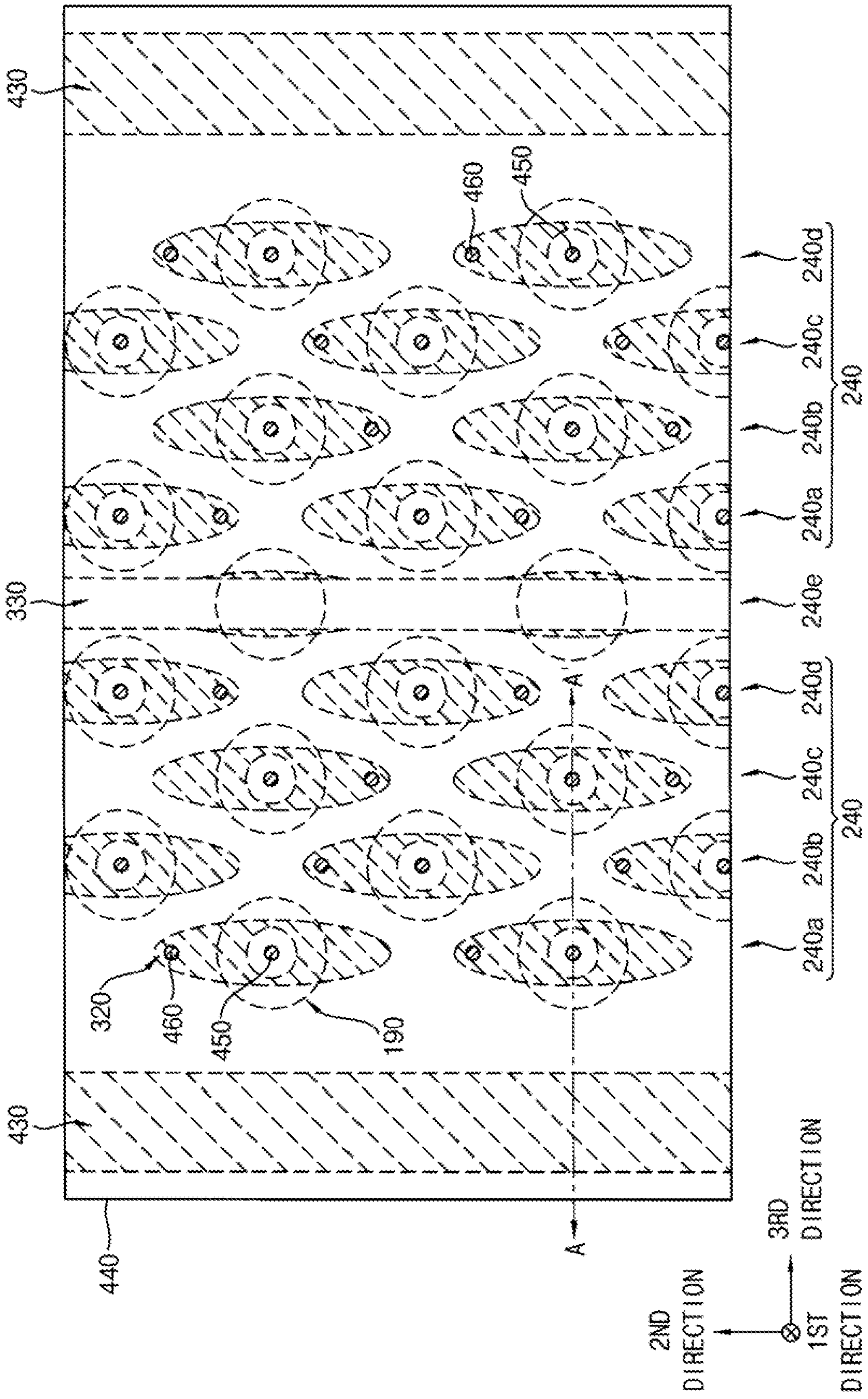
Figure 18:
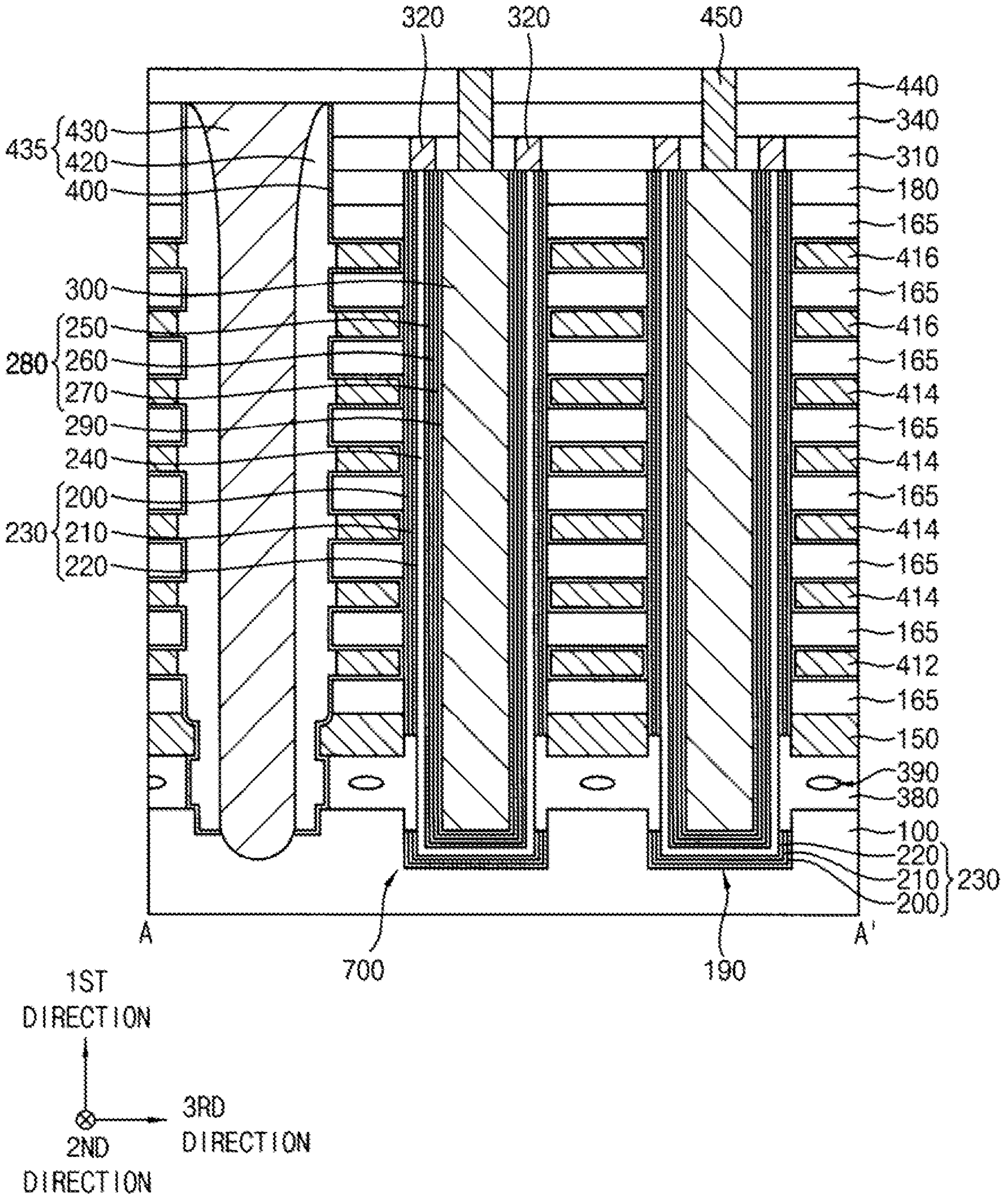

Referring to FIGS. 17 and 18, a fourth insulating interlayer 440 may be formed on the third insulating interlayer 340 and the CSL 430. A first contact plug 450 may be formed to extend through the second to fourth insulating interlayers 310, 340, and 440 to contact an upper surface of the fourth gate electrode 300. A second contact plug 460 may be formed to extend through the third and fourth insulating interlayers 340 and 440 to contact an upper surface of the conductive pad 320.

Referring to FIGS. 1 to 4 again, a fifth insulating interlayer 470 may be formed on the fourth insulating interlayer 440. First and second bit lines 480 and 490 may be formed through the fifth insulating interlayer 470 to contact upper surfaces of the first and second contact plugs 450 and 460, respectively. Thus, the vertical non-volatile memory device may be manufactured.

As described above, the inner space formed by the channel 240 of each of the pillar structure 700 may be filled with the second charge storage structure 280, the fourth blocking layer 290, and the fourth gate electrode 300 instead of a filling pattern. Thus, forming the fourth gate electrode 300 sharing the channel 240 with the first to third gate electrodes 412, 414, and 416 may be simplified.

Figure 19:
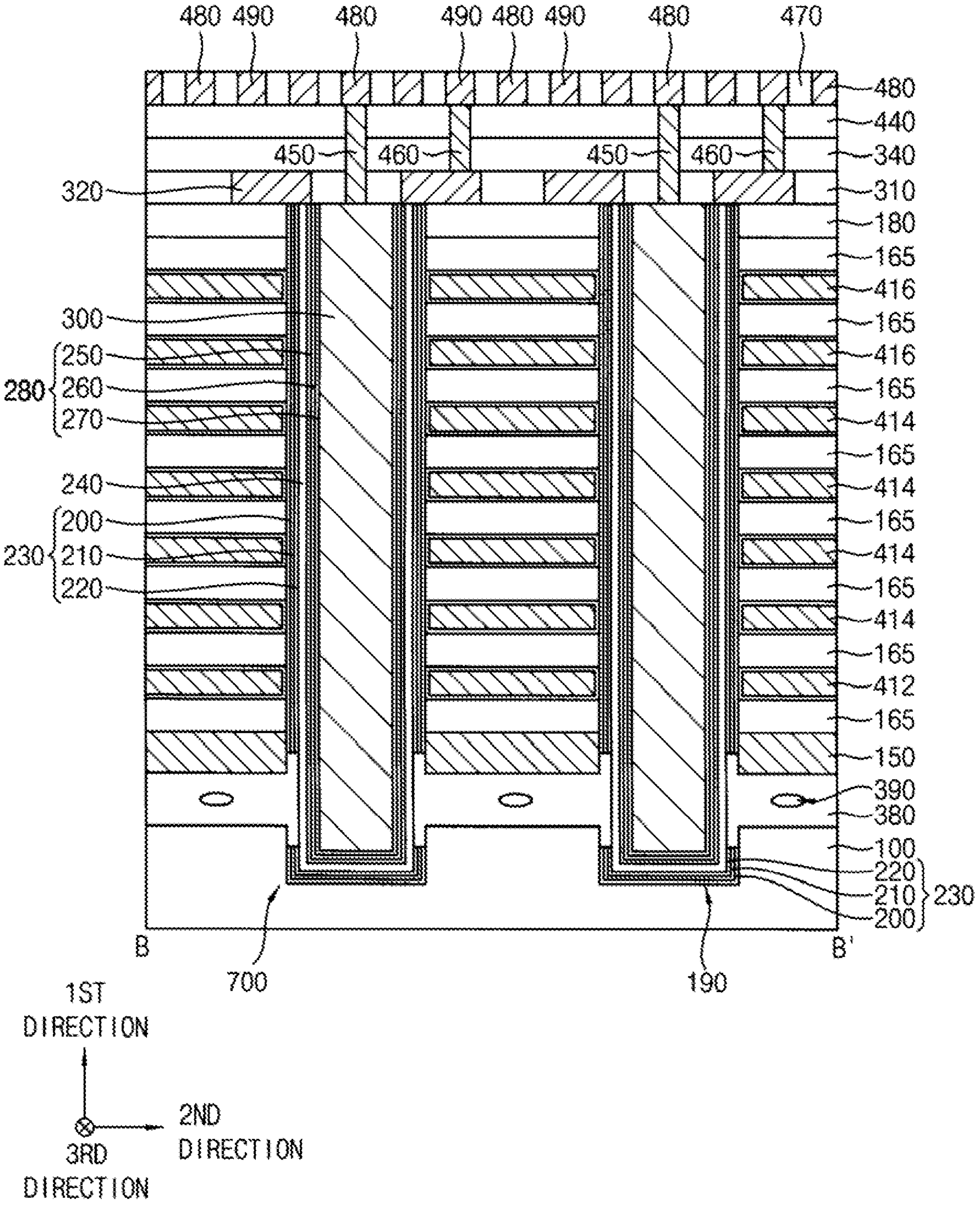
FIG. 19 is a cross-sectional view illustrating a vertical non-volatile memory device in accordance with an example embodiment.

FIG. 19 is a cross-sectional view illustrating a vertical non-volatile memory device in accordance with an example embodiment. This vertical non-volatile memory device may be substantially the same as or similar to that of FIGS. 1 to 4, except for some elements. Thus, like reference numerals refer to like elements, and the descriptions of previously described elements may not be repeated.

Referring to FIG. 19, a vertical non-volatile memory device according to the present example embodiment may not include the fourth blocking layer 290 (refer to FIG. 3), and thus may include the first charge storage structure 230, the channel 240, the second charge storage structure 280, and the fourth gate electrode 300 sequentially stacked on the sidewall of the channel hole 190 and the upper surface of the first substrate 100. The fourth gate electrode 300 may include polysilicon doped with n-type or p-type impurities instead of a metal.

Figure 20:
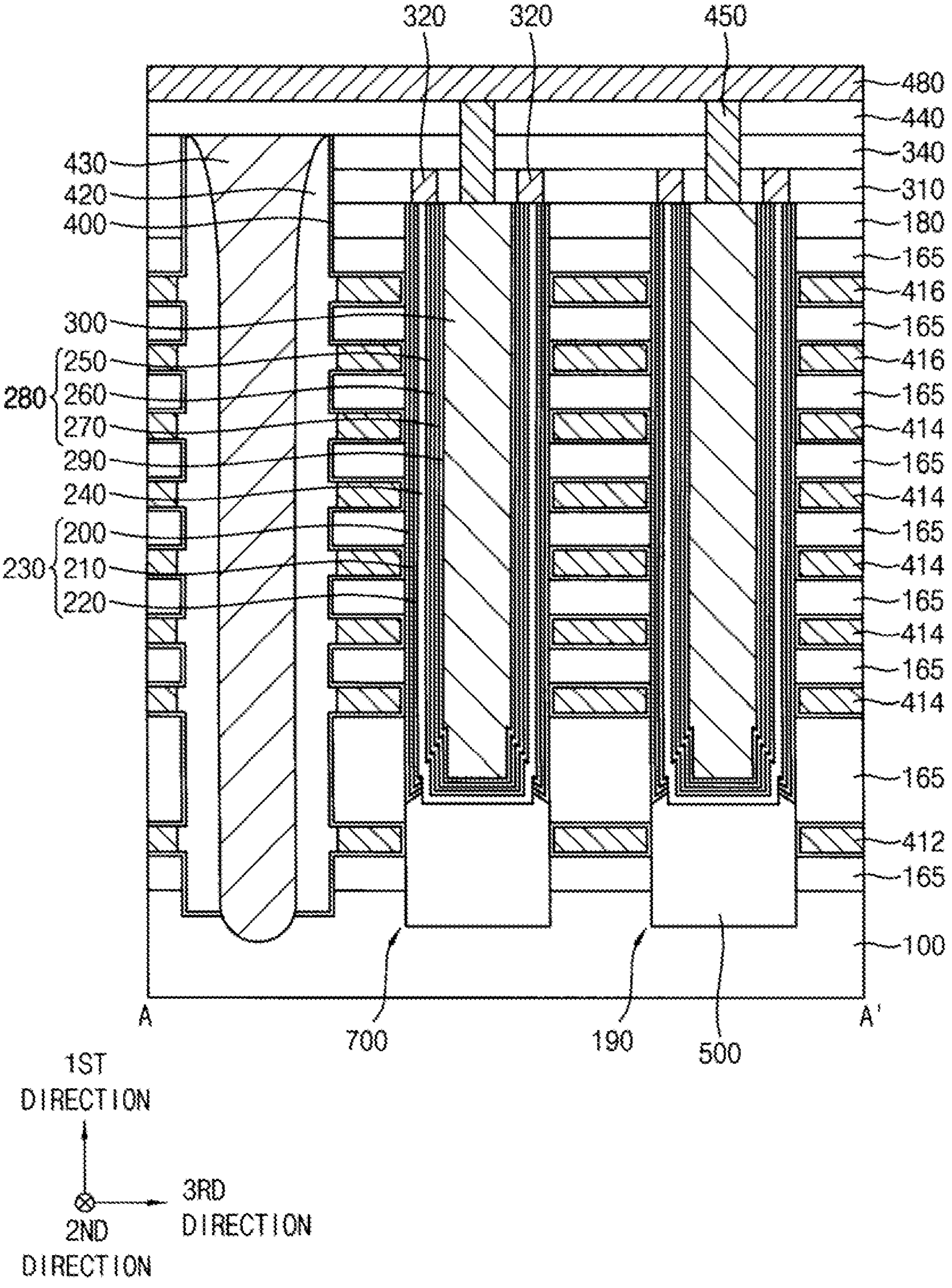
FIG. 20 is a cross-sectional view illustrating a vertical non-volatile memory device in accordance with an example embodiment.

FIG. 20 is a cross-sectional view illustrating a vertical non-volatile memory device in accordance with an example embodiment. This vertical non-volatile memory device may be substantially the same as or similar to that of FIGS. 1 to 4, except for some elements. Thus, like reference numerals refer to like elements, and the descriptions of previously described elements may not be repeated.

Referring to FIG. 20, in the present example embodiment, the pillar structure 700 may further include a semiconductor pattern 500 on the upper surface of the first substrate 100, and may not include the channel connection pattern 380, the support layer 150, or the support pattern.

The semiconductor pattern 500 may extend through an upper portion of the first substrate 100, and may also extend through a lowermost one of the insulation patterns 165 and the first gate electrode 412. In an example embodiment, a height of an upper surface of the semiconductor pattern 500 may be lower than a lower surface of one of the insulation patterns 165 at a second level from below and higher than an upper surface thereof. The semiconductor pattern 500 may include a crystalline semiconductor material, e.g., crystalline silicon.

The first charge storage structure 230 included in the pillar structure 700 may be formed on the upper surface of the semiconductor pattern 500 and the sidewall of the channel hole 190, and may have a cup-like shape of which a central bottom is opened. The channel 240 may contact the upper surface of the semiconductor pattern 500.

Figure 21:
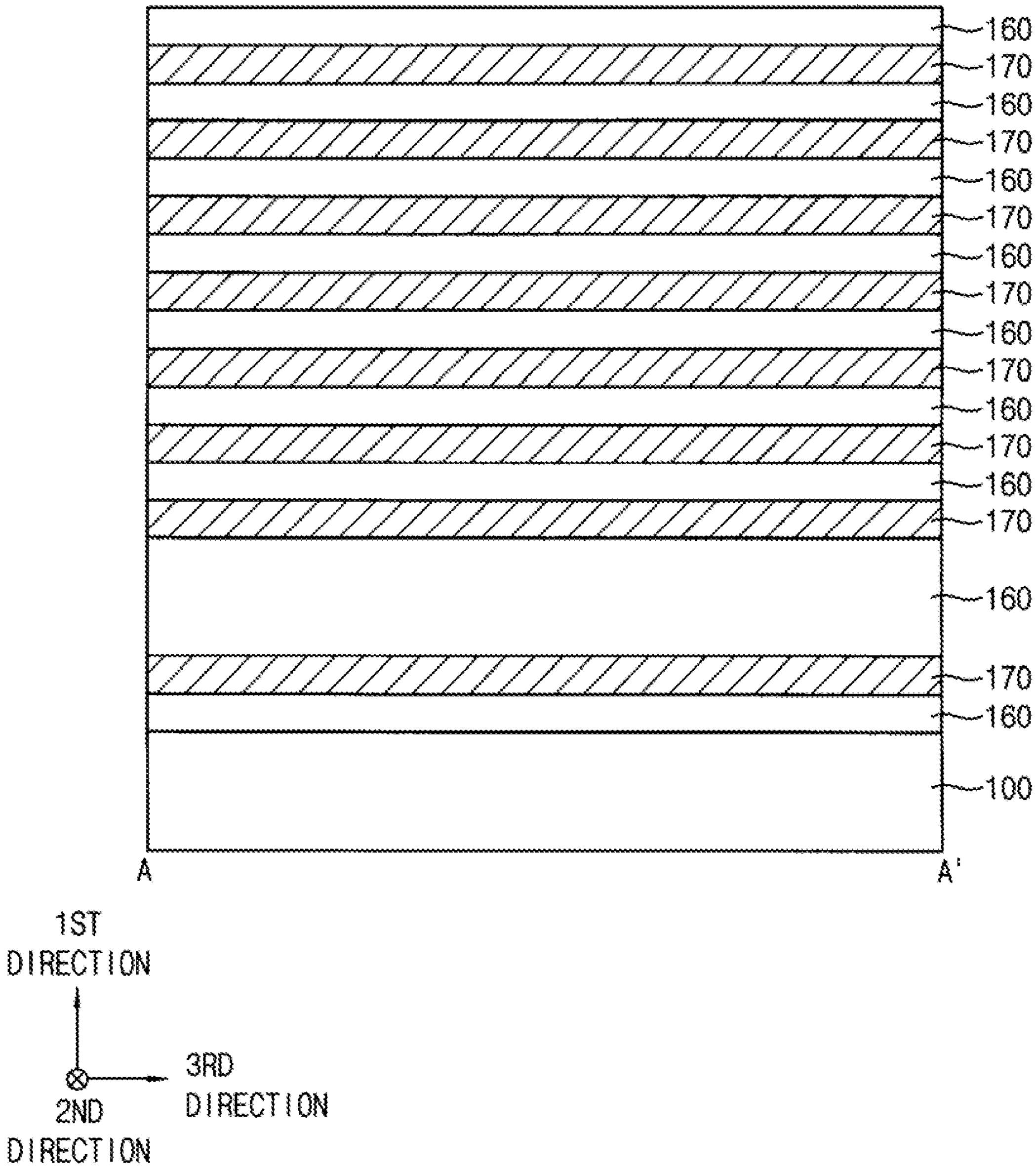
FIGS. 21 to 23 are cross-sectional views illustrating a method of manufacturing a vertical non-volatile memory device in accordance with an example embodiment.
Figure 22:
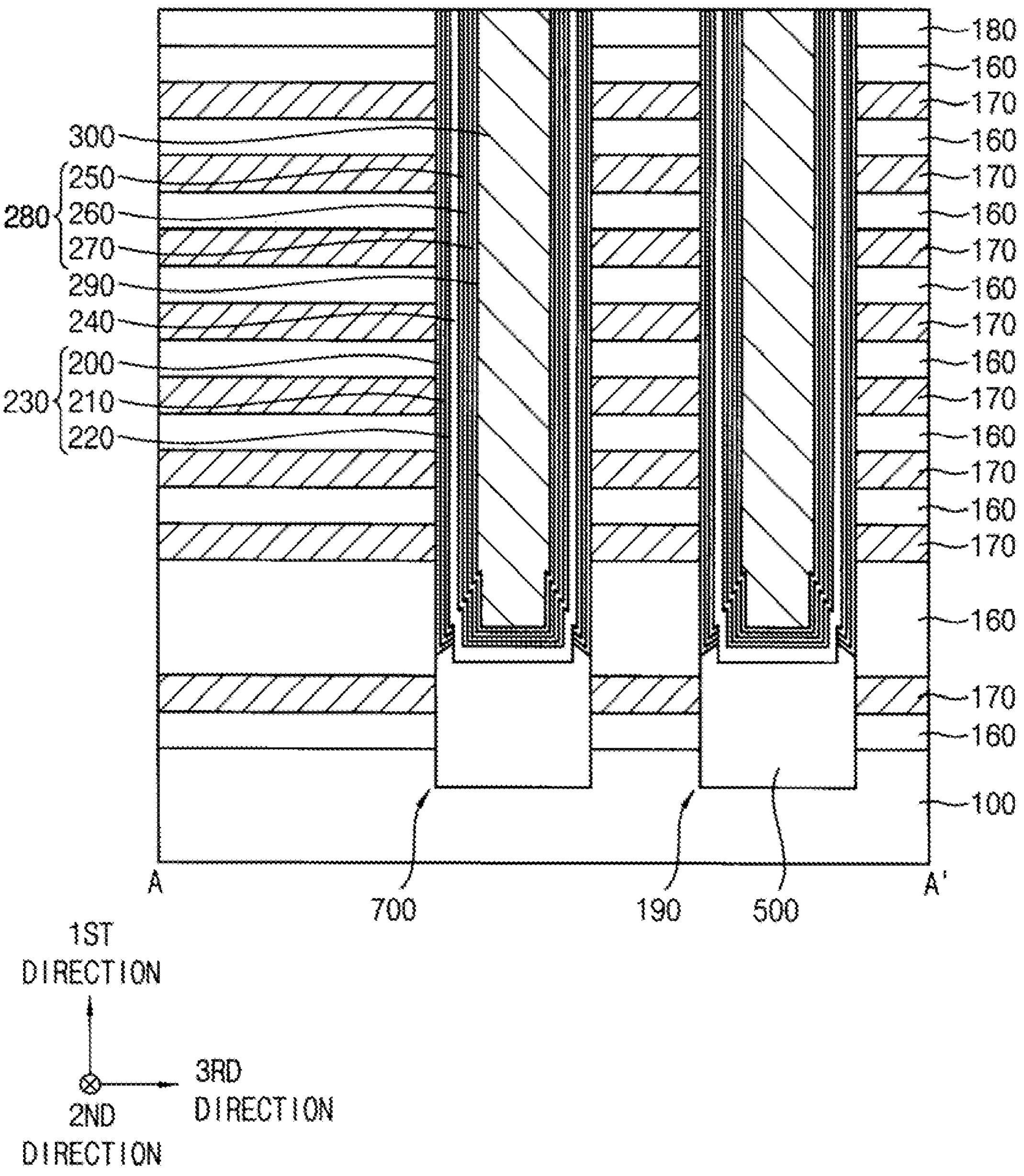
Figure 23:
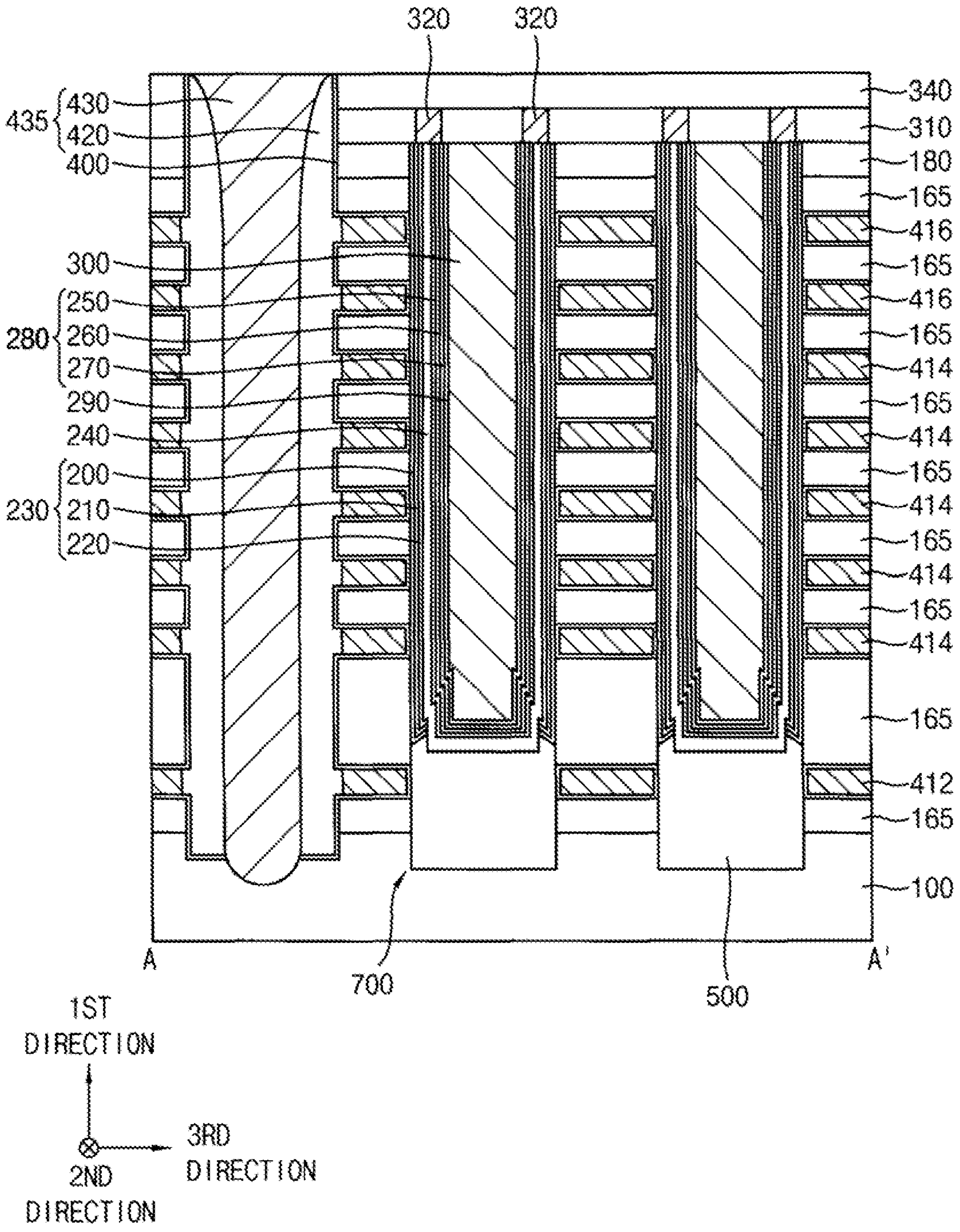

FIGS. 21 to 23 are cross-sectional views illustrating a method of manufacturing a vertical non-volatile memory device in accordance with an example embodiment. This method may include processes substantially the same as or similar to those described with reference to FIGS. 5 to 18 and FIGS. 1 to 4, and thus descriptions of previously described processes may not be repeated.

Referring to FIG. 21, according to the present example embodiment, processes substantially the same as or similar to those illustrated with reference to FIG. 5 may be performed except that the sacrificial layer structure 140 and the support layer 150 may not be formed. Thus, the insulation layer 160 and the fourth sacrificial layer 170 may be alternately and repeatedly stacked on the first substrate 100 to form the mold layer.

Referring to FIG. 22, processes substantially the same as or similar to those illustrated with reference to FIG. 6 may be performed except that a semiconductor pattern 500 may be formed on the upper surface of the first substrate 100 exposed by the channel hole 190, and other layer structures may be formed on the semiconductor pattern 500 to form the pillar structure 700. The semiconductor pattern 500 may be formed by a selective epitaxial growth (SEG) process using the upper surface of the first substrate 100 as a seed.

The first charge storage structure 230 and a third spacer layer (not shown) may be sequentially formed on the sidewall of the channel hole 190, the upper surface of the semiconductor pattern 500, and the upper surface of the first insulating interlayer 180. The third spacer layer may be anisotropically etched to form a third spacer (not shown) on the sidewall of the channel hole 190. The first charge storage structure 230 may be etched using the third spacer as an etching mask to have a cup-like shape of which a central bottom is opened on the upper surface of the semiconductor pattern 500 and the sidewall of the channel hole 190, and an upper portion of the semiconductor pattern 500 may be also partially removed.

After removing the third spacer, the channel 240, the second charge storage structure 280, the fourth blocking layer 290, and the fourth gate electrode 300 may be sequentially stacked on the exposed upper surface of the semiconductor pattern 500, the first charge storage structure 230, and the first insulating interlayer 180, and then planarized until the upper surface of the first insulating interlayer 180 is exposed to form the pillar structure 700. Thus, the channel 240 may contact the semiconductor pattern 500.

Referring to FIG. 23, processes substantially the same as or similar to those illustrated with reference to FIGS. 6 to 13 may be performed except that the second opening 350 may extend through the mold to expose an upper surface of the first substrate 100, and the first spacer 360 may not be formed.

Processes substantially the same as or similar to those illustrated with reference to FIGS. 16 to 18 may be performed so that the first to third gate electrodes 412, 414, and 416, the third blocking layer 400, the second spacer 420, and the CSL 430 are formed.

Referring to FIG. 20 again, processes substantially the same as or similar to FIGS. 1 to 4 may be performed to complete the fabrication of the vertical non-volatile memory device.

Figure 24:
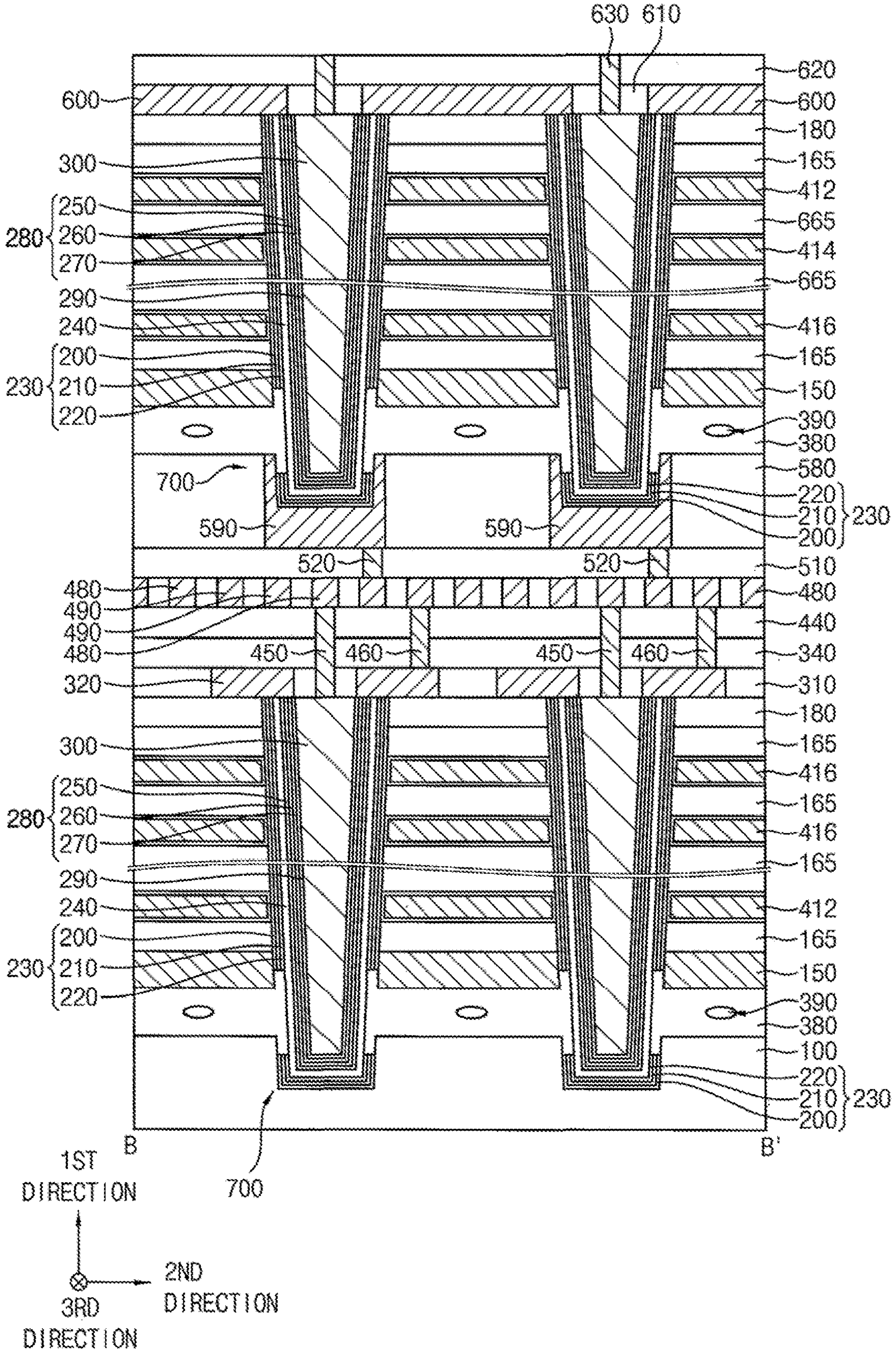
FIGS. 24 to 26 are cross-sectional views illustrating vertical non-volatile memory devices in accordance with an example embodiment.
Figure 25:
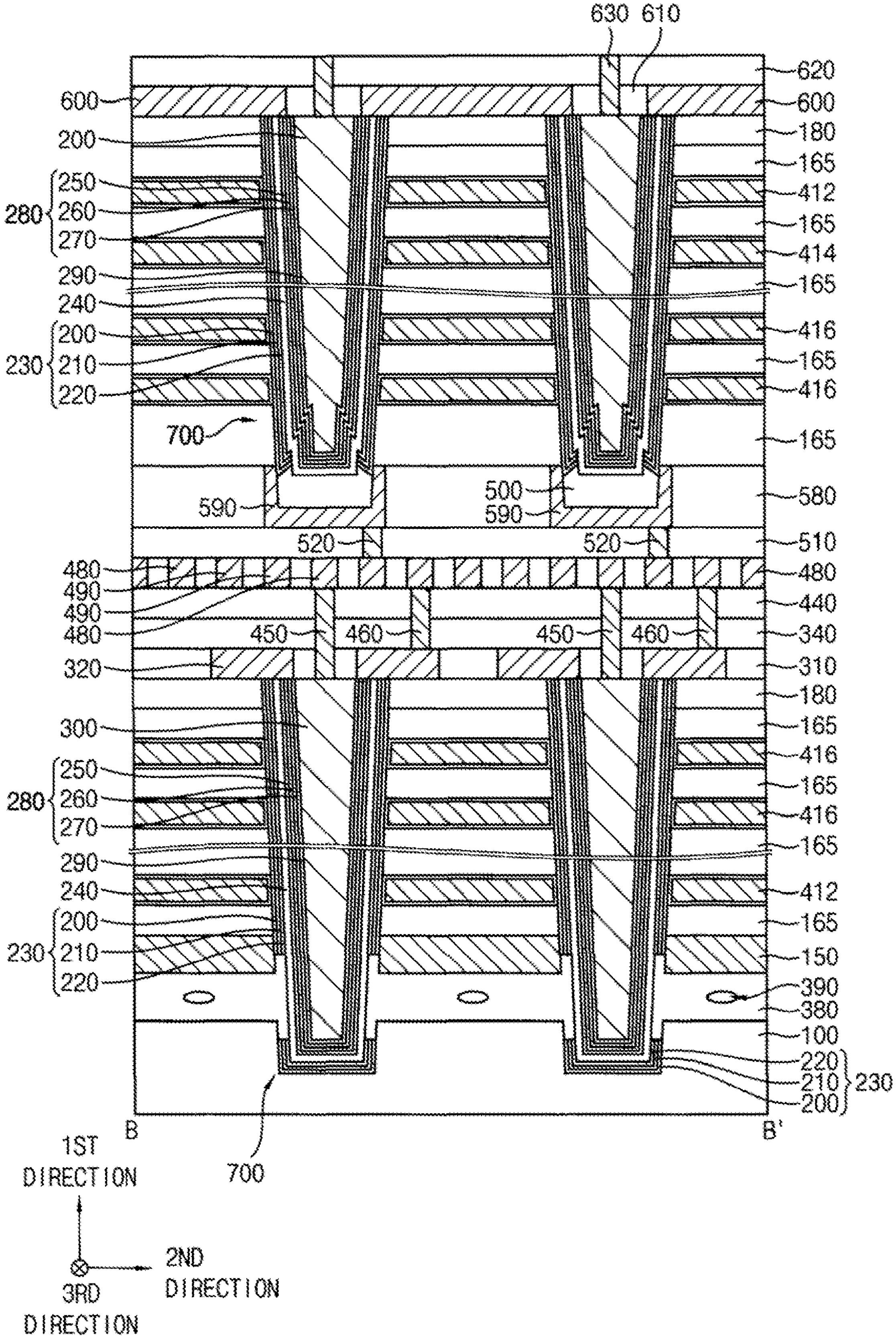
Figure 26:
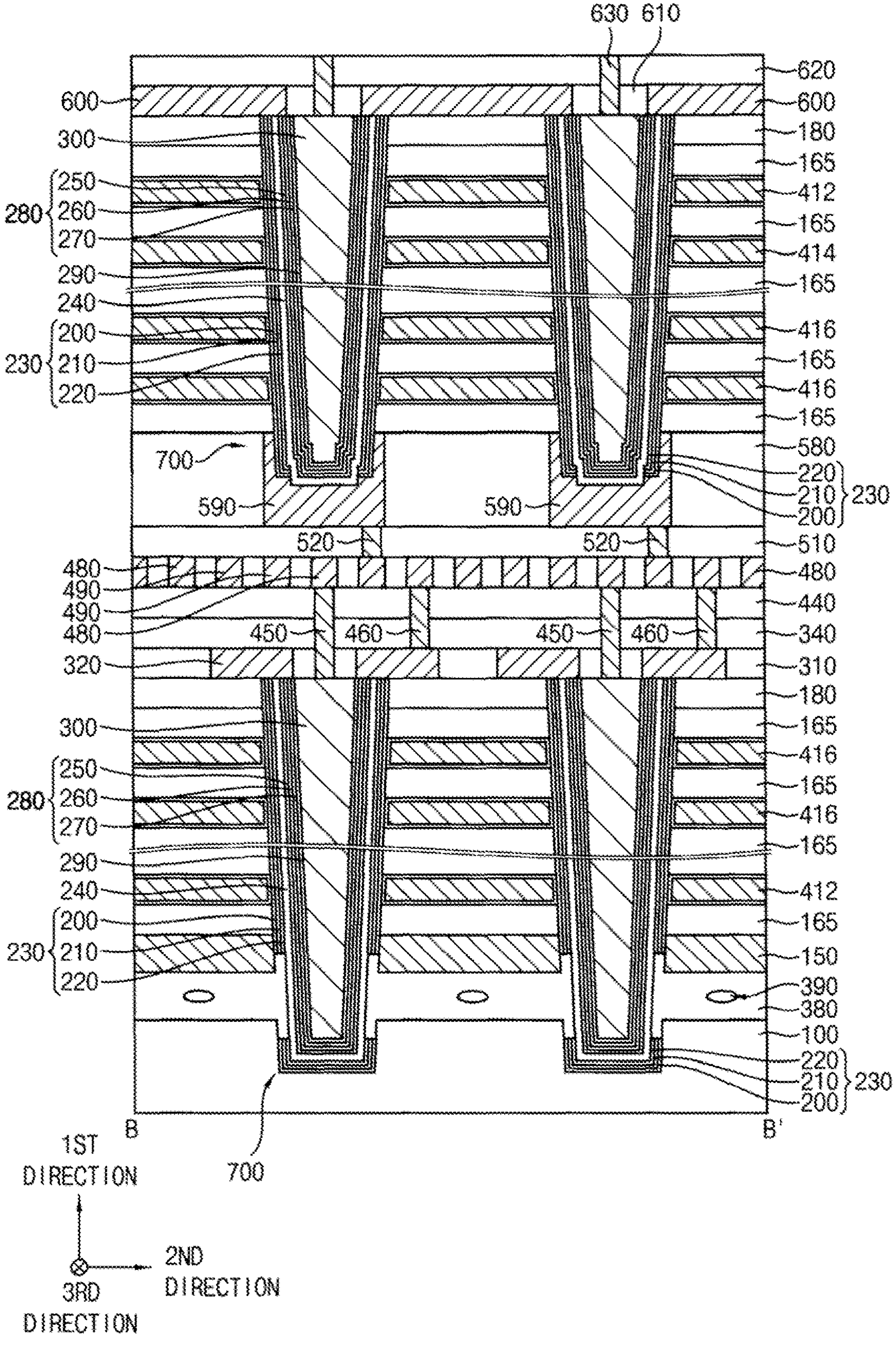

FIGS. 24 to 26 are cross-sectional views illustrating vertical non-volatile memory devices in accordance with an example embodiment. These vertical non-volatile memory devices may include elements substantially the same as or similar to those of FIGS. 1 to 4, and thus the descriptions of previously described elements may not be repeated.

Referring to FIG. 24, according to the present example embodiment, the vertical non-volatile memory device may have a stacked structure including two vertical non-volatile memory devices, each of which is shown in FIGS. 1 to 4, stacked in the first direction. Hereinafter, lower and upper vertical non-volatile memory devices may be referred to as first and second vertical non-volatile memory devices, respectively, and may be also referred to as first and second memory structures, respectively.

According to the present example embodiment, the second vertical non-volatile memory device may not include bit lines, and may be electrically connected to the second bit line 490 of the first vertical non-volatile memory device through a conductor 590 on which the pillar structure 700 is formed. Thus, the first and second bit lines 480 and 490 may be formed between the first and second vertical non-volatile memory devices, and the second bit line 490 may be shared by the first and second vertical non-volatile memory devices. The conductor 590 may be electrically connected to the second bit line 490 through a third contact plug 520 extending through a sixth insulating interlayer 510.

In an example embodiment, the conductor 590 may cover a bottom surface and a lower sidewall of each of the pillar structures 700, and thus a plurality of conductors 590 may be formed in the second and third directions.

In an example embodiment, the conductor 590 may be formed by forming a semiconductor substrate on the sixth insulating interlayer 510 on the fifth insulating interlayer 470 and the first and second bit lines 480 and 490 of the first vertical non-volatile memory device, and patterning the semiconductor substrate. N-type or p-type impurities may be doped into the semiconductor substrate, and thus the conductor 590 may have conductivity. A sidewall of the conductor 590 may be covered by a seventh insulating interlayer 580. The channel connection pattern 380 of the second vertical non-volatile memory device may be formed on the seventh insulating interlayer 580.

A second substrate 600 may be formed on the channel 240 included in the pillar structure 700 of the second vertical non-volatile memory device, and may contact the channel 240. The second substrate 600 may include a third opening exposing the fourth gate electrode 300, and the third opening may be filled with an insulating filling pattern 610. The second substrate 600 may include a material substantially the same as that of the first substrate 100.

An eighth insulating interlayer 620 may be formed on the second substrate 600 and the insulating filling pattern 610. A fourth contact plug 630 may extend through the eighth insulating interlayer 620 and the insulating filling pattern 610 to contact an upper surface of the fourth gate electrode 300. The fourth contact plug 630 may be electrically connected to an upper wiring (not shown).

Referring to FIG. 25, unlike that of FIG. 24, the second vertical non-volatile memory device may have a structure similar to that of the vertical non-volatile memory device of FIG. 20. Thus, the semiconductor pattern 500 may be formed on the conductor 590, and the channel 240 may be formed on the semiconductor pattern 500.

Referring to FIG. 26, unlike that of FIG. 25, the semiconductor pattern 500 may not be formed on the conductor 590, and the channel 240 may be directly formed on the conductor 590.

The second vertical non-volatile memory devices shown in FIGS. 24 to 26, which may be upper vertical non-volatile memory devices, have similar structures of that of FIGS. 1 to 4. Thus, the first vertical non-volatile memory devices shown in FIGS. 24 to 26, which may be lower vertical non-volatile memory devices, may have similar structures of that of FIGS. 1 to 4.

A method of operating a vertical non-volatile memory device according to an example embodiment will be explained below.

FIGS. 27 to 32 are equivalent circuit diagrams, a timing diagram, and an energy band diagram.

The vertical non-volatile memory device may include a plurality of memory blocks each of which may include a plurality of memory cells. The plurality of memory blocks may form a memory cell array. Each of the memory blocks may include NAND strings or cell strings having a vertical structure. Each of the cell strings may include a string selection transistor SST, the plurality of memory cells, and a ground selection transistor GST disposed in series between a bit line BL and common source line CSL.

The string selection transistors SSTs disposed in the second direction may be electrically connected to a string selection line SSL. The ground selection transistors GSTs disposed in the second direction may be electrically connected to a ground selection line GSL. Front gates FGs included in the memory cells disposed in the second direction may be electrically connected to a word line WL.

In the vertical non-volatile memory device according to the present example embodiment, one channel 240 (refer to FIGS. 3 and 4) may be shared by a front gate FG and a back gate BG. Together with the front gate FG, the first charge storage structure 230, and the channel 240, the back gate BG and the second charge storage structure 280 may form each of the memory cells. The memory cells included in each of the cell strings may commonly include the back gate BG.

Figure 27:
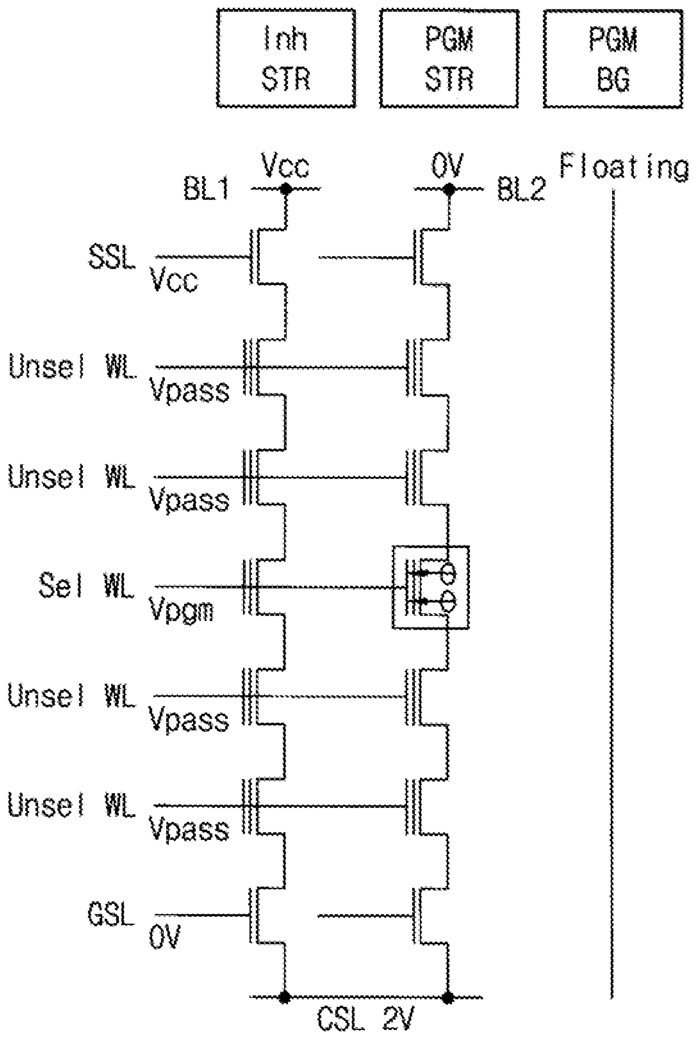
FIGS. 27 to 32 are equivalent circuit diagrams, a timing diagram, and an energy band diagram.

FIG. 27 is an equivalent circuit diagram illustrating a method of programming each memory cell through the front gate FG, the channel 240, and the first charge storage structure 230 in the vertical non-volatile memory device.

Referring to FIG. 27, a supply voltage Vcc and 0V may be applied to first and second bit lines BL1 and BL2, respectively, which are connected to an inhibit string Inh STR and a program string PGM STR, respectively, and a supply voltage Vcc and 0V may be applied to a string selection line SSL and a ground selection line GSL, respectively. In the above state, a pass voltage Vpass and a program voltage Vpgm may be applied to an unselected word line Unsel WL and a selected word line Sel WL, respectively, so that charge may be stored in the first charge storage layer 210 (refer to FIGS. 3 and 4) by the front gate FG connected to the selected word line Sel WL and that a corresponding memory cell may be programmed.

The back gate BG commonly included in the memory cells of the program string PGM STR, which may be referred to as a program back gate PGM BG, may be in a floating state, and thus may have no influence on the programming of the memory cell by the front gate FG. The back gate BG commonly included in the memory cells of the inhibit string Inh STR, which may be referred to as an inhibit back gate, may be also in a floating state.

Figure 28:
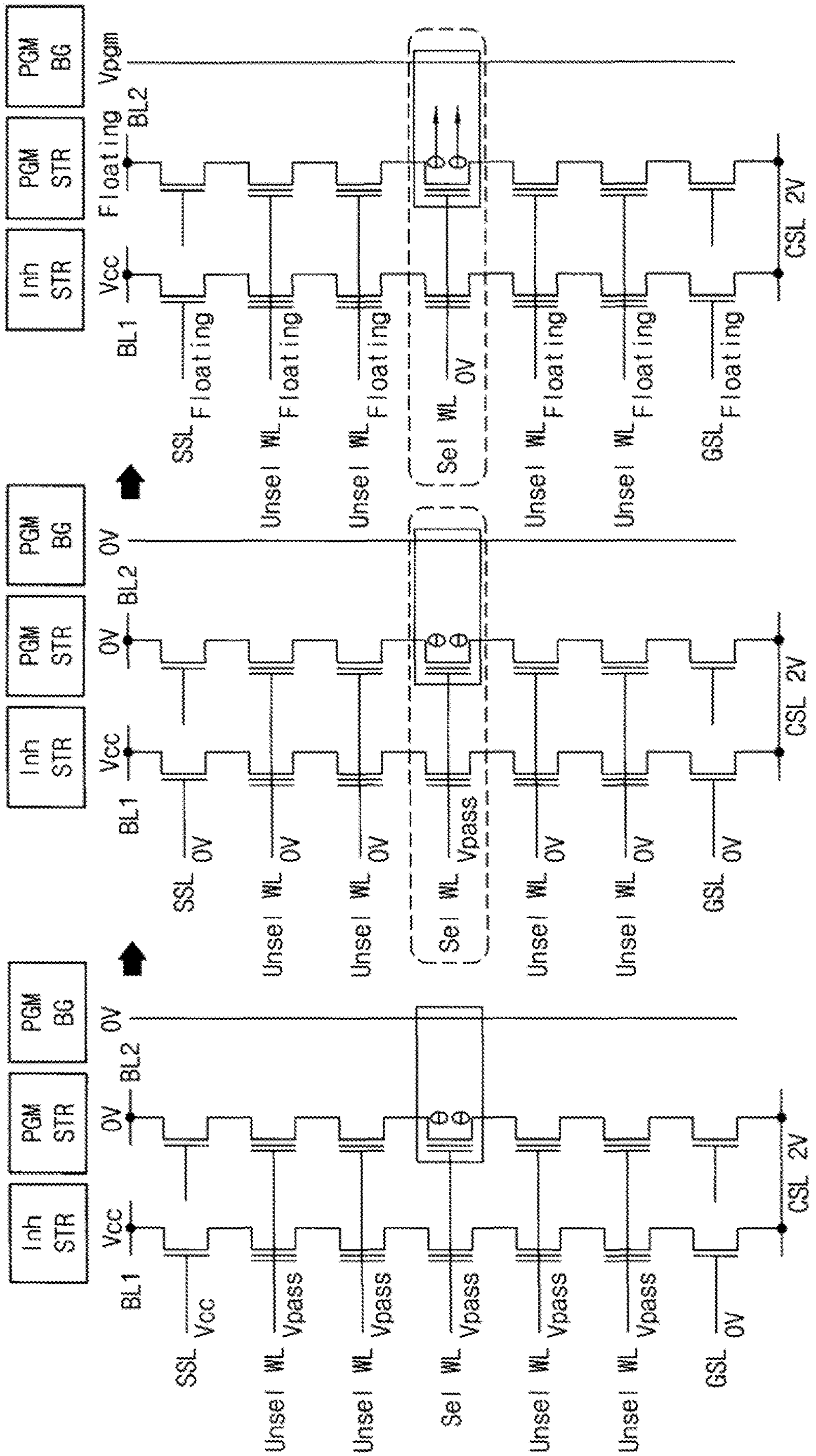
Figure 29:
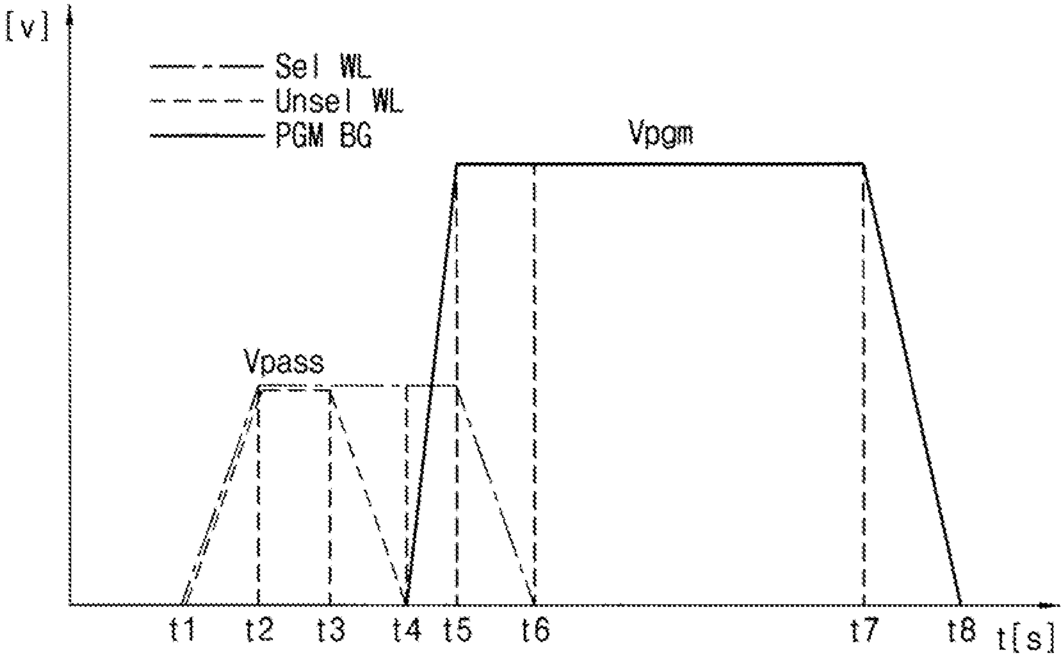
Figure 30:
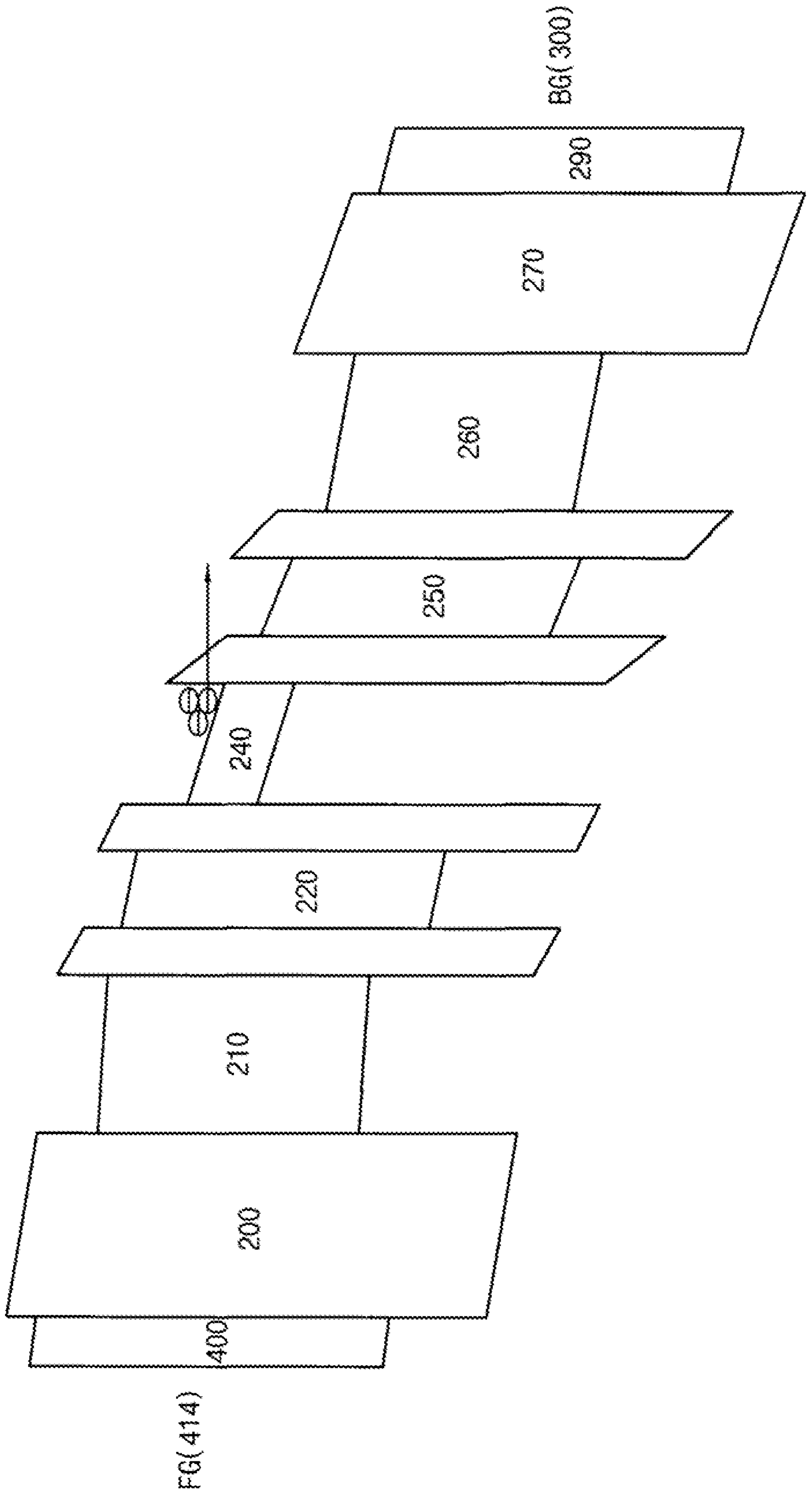

FIGS. 28, 29, and 30 are an equivalent circuit diagram, a timing diagram, and an energy band diagram, respectively, illustrating a method of programming a memory cell using the back gate BG, the channel 240, and the second charge storage structure 280 in the vertical non-volatile memory device.

Referring to FIGS. 28 and 29, a supply voltage Vcc and 0V may be applied to a first bit line BL1 and a program back gate PGM BG, respectively, connected to an inhibit string Inh STR, 0V may be applied to a second bit line BL2 connected to a string including memory cells in which program back gate PGM BG is commonly included, which may be referred to as a program string PGM STR, and a supply voltage Vcc and 0V may be applied to a string selection line SSL and a ground selection line GSL, respectively. The back gate BG commonly included in the memory cells included in the inhibit string Inh STR, i.e., the inhibit back gate Inh BG, may be in a floating state.

In the above state, at a first time t1, voltages may start being applied to an unselected word line Unsel WL and a selected word line Sel WL, and reach a pass voltage Vpass at a second time t2, which may be kept until a third time t3. Thus, charge may be induced due to the inversion by each of the front gates FGs into the channel 240 included in each of the memory cells connected to the selected word line Sel WL and the unselected word line Unsel WL.

The voltages of the string selection line SSL and the unselected word line Unsel WL may decrease, and may be 0V at a fourth time t4, while the voltage of the selected word line Sel WL may remain at the pass voltage Vpass. Thus, the charge induced by the front gate FG may be kept in the channel 240 included in the memory cell connected to the selected word line Sel WL, while the charge induced by each of the front gates FGs in the channel 240 included in each of the memory cells connected to the unselected word line Unsel WL may dissipate.

The voltage of the program back gate PGM BG may increase, and reach a program voltage Vpgm at a fifth time t5, while the voltage of the selected word line Sel WL may remain at the pass voltage Vpass.

The voltage of the selected word line Sel WL may decrease, and reach 0V at a sixth time t6, while the voltage of the program back gate PGM BG may remain at the program voltage Vpgm.

The voltage of the program back gate PGM BG may remain at the program voltage Vpgm until a seventh time t7, and in this state, all of the string selection line SSL, the unselected word line Unsel WL, the ground selection line GSL, and the program string PGM STR may be in a floating state (the inhibit back gate Inh BG may be also in a floating state).

Referring to FIG. 30, the charge induced due to the inversion by the pass voltage Vpass applied to the selected word line Sel WL into the channel 240 of each of the memory cells connected to the selected word line Sel WL may move, from the fifth time t5, to the second charge storage layer 260 and may be stored in a FN tunneling method by the program voltage Vpgm applied to the program back gate PGM BG. Thus, the corresponding memory cell may be programmed.

The voltage of the program back gate PGM BG may decrease, and may reach 0V at an eighth time t8.

Figure 31:
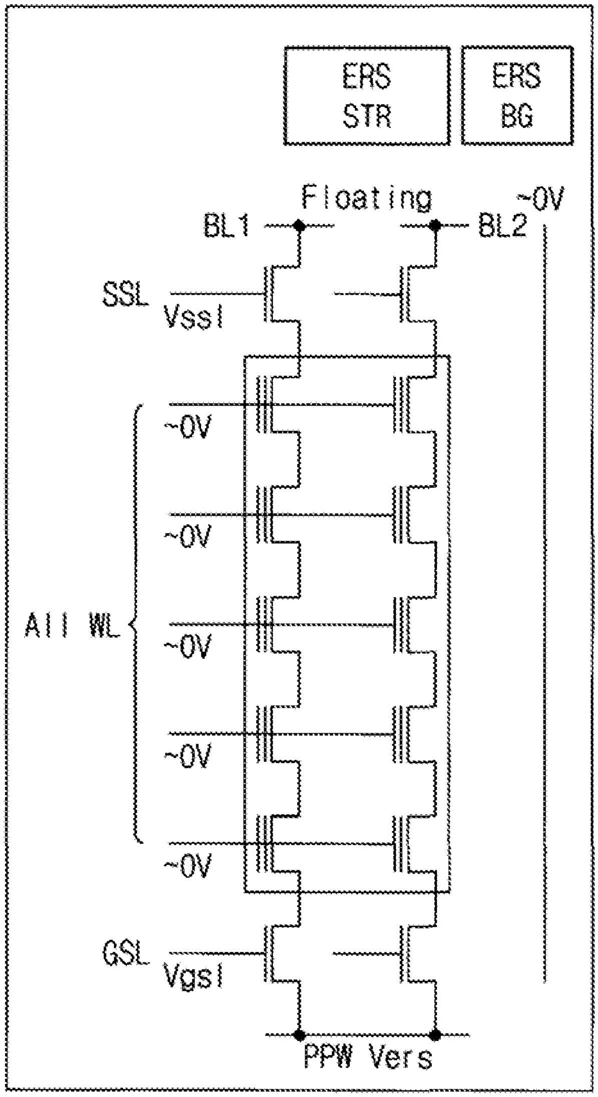

FIG. 31 is an equivalent circuit diagram illustrating a method of erasing memory cells in the vertical non-volatile memory device.

Referring to FIG. 31, an erasing operation of each of the memory cells may be performed by a unit of a memory block. Bit lines connected to the erase strings ERS STR included in the memory block, e.g., a first bit line B1 and a second bit line B2, may be in a floating state, and a erase voltage may be applied to a pocket p-well PPW in the first substrate 100 (refer to FIGS. 3 and 4) on which the erase strings ERS STR are formed. In the above state, an SSL voltage Vssl and a GSL voltage Vgsl may be applied to the string selection line SSL and the ground selection line GSL, respectively, a voltage equal to or less than 0V may be applied to all word lines All WL, and a voltage equal to or less than 0V may be applied to the erase back gate ERS BG, so that all memory cells included in the memory cell block may be erased.

Figure 32:
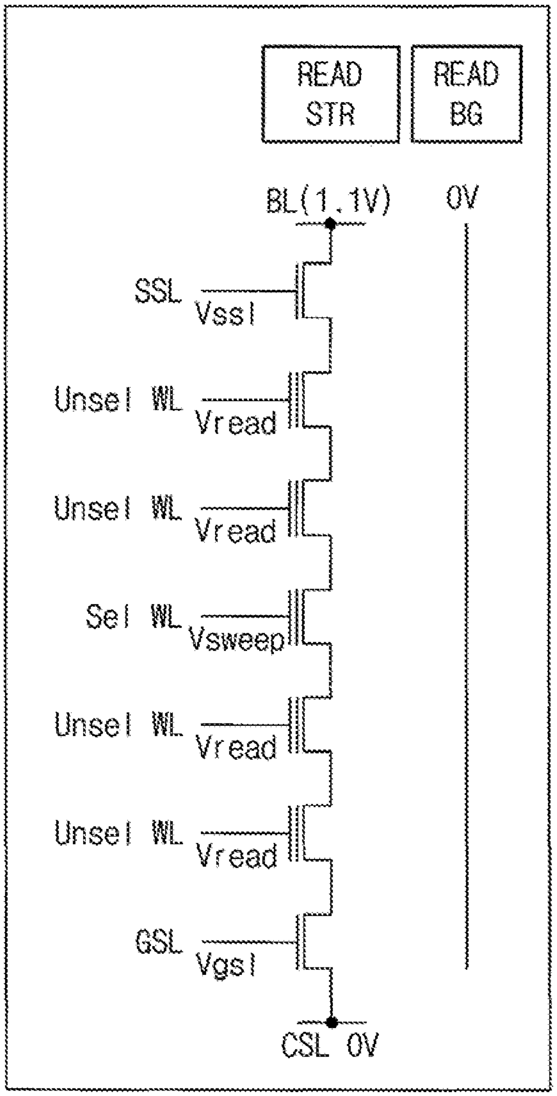

FIG. 32 is an equivalent circuit diagram illustrating a method of reading memory cells in the vertical non-volatile memory device.

Referring to FIG. 32, e.g., 1.1V and 0V may be applied to a bit line BL and a common source line CSL, respectively, connected to a read string READ STR, a SSL voltage Vssl and a GSL voltage Vgsl may be applied to the string selection line SSL and the ground selection line GSL, respectively, a read voltage Vread and a sweep voltage Vsweep may be applied to the unselected word line Unsel WL and the selected word line Sel WL, respectively, and 0V may be applied to the back gate BG commonly included in the memory cells of the read string READ STR (which may be referred to as a read back gate READ BG) so that each of the memory cells connected to the selected word line Sel WL may be read.

As described above, in the vertical non-volatile memory device, each of the memory cells may include the back gate (BG) and the second charge storage structure 280, in addition to the front gate (FG), the channel 240, and the first charge storage structure 230. Thus, in addition to the threshold voltage obtained by the front gate (FG), the channel 240, and the first charge storage structure 230, a threshold voltage may be further obtained by the back gate (BG), the channel 240, and the second charge storage structure 280. As a result, each of the memory cells may have the characteristics of a multi-level cell (MLC).

For example, if 1 bit, 2 bits, and 3 bits of data are stored in a memory cell by the front gate (FG), and 3 bits, 2 bits, and 1 bit of data are stored by the back gate (BG) in the memory cell, the memory cell may be a quadruple level cell (QLC) in which 4 bits of data may be stored. If 2 bit and 3 bits of data are stored in a memory cell by the front gate (FG), and 3 bits and 2 bits of data are stored by the back gate (BG) in the memory cell, the memory cell may be a penta level cell (PLC) in which 5 bits of data may be stored. If 3 bits of data are stored in a memory cell by the front gate (FG), and 3 bits of data are stored by the back gate (BG) in the memory cell, the memory cell may be a hexa level cell (HLC) in which 6 bits of data may be stored.

By way of summation and review, in order to program or read a multi-level cell (MLC), threshold voltage distributions are spaced apart from each other to a certain degree. However, as the integration degree of the VNAND flash memory device increases, the threshold voltage distributions may be widened due to the coupling of neighboring memory cells, and thus the respective spacings or voltage distributions may become more difficult to distinguish.

As described above, embodiments may provide a vertical non-volatile memory device having improved characteristics and a method of programming the same.

In a vertical non-volatile memory device in accordance with one or more example embodiments, first and second charge storage structures may be formed on outer and inner sidewalls of a channel. Thus, in addition to the threshold voltage obtained by a front gate, the channel, and the first charge storage structure, a threshold voltage may be further obtained by a back gate, the channel, and the second charge storage structure. Accordingly, a multi-level cell may be easily realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical non-volatile memory device, comprising:

a channel on a substrate, the channel extending in a first direction perpendicular to an upper surface of the substrate;

a first charge storage structure on an outer sidewall of the channel;

a second charge storage structure on an inner sidewall of the channel;

first gate electrodes spaced apart from each other in the first direction on the substrate, each of the first gate electrodes surrounding the first charge storage structure; and a second gate electrode on an inner sidewall of the second charge storage structure, wherein:

the channel has a ring shape in a plan view, and the second gate electrode is disposed inside the ring shape of the channel and is completely encircled by the channel in the plan view.

2. The vertical non-volatile memory device as claimed in claim 1, wherein:

the first charge storage structure includes a first tunnel insulation layer, a first charge storage layer, and a first blocking layer sequentially stacked from the outer sidewall of the channel, and the second charge storage structure includes a second tunnel insulation layer, a second charge storage layer, and a second blocking layer sequentially stacked from the inner sidewall of the channel.

3. The vertical non-volatile memory device as claimed in claim 2, wherein each of the first and second tunnel insulation layers includes silicon oxide, each of the first and second charge storage layers includes silicon nitride, and each of the first and second blocking layers includes silicon oxide.

4. The vertical non-volatile memory device as claimed in claim 2, further comprising a third blocking layer between each of the first gate electrodes and the first charge storage structure, the third blocking layer including a metal oxide.

5. The vertical non-volatile memory device as claimed in claim 2, wherein:

the second gate electrode includes a metal, and a third blocking layer is disposed between the second gate electrode and the second charge storage structure, the third blocking layer including a metal oxide.

6. The vertical non-volatile memory device as claimed in claim 2, wherein:

the second gate electrode includes polysilicon doped with impurities, and the second gate electrode directly contacts the second charge storage structure.

7. The vertical non-volatile memory device as claimed in claim 1, further comprising a conductive pad contacting an upper surface of the channel.

8. The vertical non-volatile memory device as claimed in claim 7, wherein the conductive pad has a ring shape in the plan view.

9. The vertical non-volatile memory device as claimed in claim 8, wherein the conductive pad has the ring shape including an elliptical outer contour and a circular inner contour in the plan view.

10. The vertical non-volatile memory device as claimed in claim 9, wherein the conductive pad has the ring shape including a rectangular outer contour and a circular inner contour in the plan view.

11. The vertical non-volatile memory device as claimed in claim 7, wherein the conductive pad does not contact the second gate electrode.

12. The vertical non-volatile memory device as claimed in claim 11, further comprising:

a first bit line electrically connected to the conductive pad; and a second bit line electrically connected to the second gate electrode.

13. The vertical non-volatile memory device as claimed in claim 12, further comprising:

a first contact plug contacting an upper surface of the conductive pad and a bottom surface of the first bit line; and a second contact plug contacting an upper surface of the second gate electrode and a bottom surface of the second bit line.

14. The vertical non-volatile memory device as claimed in claim 12, wherein:

a plurality of first bit lines and a plurality of second bit lines are formed to be spaced apart from each other in a second direction parallel to the upper surface of the substrate, and two of the plurality of first bit lines are disposed between neighboring ones of the plurality of second bit lines in the second direction.

15. The vertical non-volatile memory device as claimed in claim 14, wherein:

each of the first gate electrodes extends in the second direction, and each of the first and second bit lines extends in a third direction parallel to the upper surface of the substrate and crossing the second direction.

16. The vertical non-volatile memory device as claimed in claim 1, wherein:

a plurality of channels is spaced apart from each other in a horizontal direction parallel to the upper surface of the substrate, and a channel connection pattern is disposed under the first gate electrodes on the substrate, the channel connection pattern configured to connect the plurality of channels with each other.

17. The vertical non-volatile memory device as claimed in claim 16, further comprising a support layer between the channel connection pattern and the first gate electrodes, the support layer including polysilicon doped with impurities.

18. The vertical non-volatile memory device as claimed in claim 1, wherein:

the first charge storage structure includes an upper portion covering an outer sidewall of the channel and a lower portion covering a bottom surface of the channel, and the second charge storage structure has a cupped shape.

19. A vertical non-volatile memory device, comprising:

a channel on a substrate, the channel extending in a first direction perpendicular to an upper surface of the substrate and having a cup-like shape in a vertical cross-sectional view;

a first charge storage structure on an outer sidewall of the channel;

first gate electrodes spaced apart from each other in the first direction on the substrate, each of the first gate electrodes surrounding the first charge storage structure;

a second gate electrode in an inner space formed by the channel; and a conductive pad having a ring shape, the conductive pad contacting an upper surface of the channel and not contacting an upper surface of the second gate electrode, wherein:

the channel has a ring shape in a plan view, the ring shape of the channel encircling the inner space formed by the channel, and the second gate electrode is disposed inside the ring shape of the channel and is completely encircled by the channel in the plan view.

20. A vertical non-volatile memory device, comprising:

a channel on a substrate, the channel extending in a first direction perpendicular to an upper surface of the substrate;

a first charge storage structure on an outer sidewall of the channel;

a second charge storage structure on an inner sidewall of the channel;

first gate electrodes spaced apart from each other in the first direction on the substrate, each of the first gate electrodes surrounding the first charge storage structure;

a second gate electrode on an inner sidewall of the second charge storage structure;

a conductive pad on an upper surface of the channel;

a first contact plug on the conductive pad;

a first bit line on the first contact plug;

a second contact plug on an upper surface of the second gate electrode; and a second bit line on the second gate electrode, wherein:

the channel has a ring shape in a plan view, and the second gate electrode is disposed inside the ring shape of the channel and is completely encircled by the channel in the plan view.

* * * * *